United States Patent [19]

Yasuhara et al.

[11] Patent Number: 5,751,022

[45] Date of Patent: May 12, 1998

[54] THYRISTOR

[75] Inventors: Norio Yasuhara; Akio Nakagawa, both of Kanagawa-ken; Tomoko Matsudai; Hideyuki Funaki, both of Tokyo, all of Japan

[73] Assignee: Kabushiki Kaisha Toshiba, Kawasaki, Japan

[21] Appl. No.: 806,153

[22] Filed: Feb. 25, 1997

Related U.S. Application Data

[63] Continuation of Ser. No. 400,980, Mar. 8, 1995, abandoned.

[30] Foreign Application Priority Data

Mar. 9, 1994 [JP] Japan ................................ 6-038196
Sep. 30, 1994 [JP] Japan ................................ 6-259596

[51] Int. Cl.⁶ ........................... H01L 29/74; H01L 31/111
[52] U.S. Cl. .................... 257/133; 257/145; 257/146; 257/147; 257/154; 257/157; 257/161
[58] Field of Search ............................. 257/133, 145, 257/146, 147, 154, 157, 161

[56] References Cited

U.S. PATENT DOCUMENTS

| | | | |
|---|---|---|---|
| 5,072,287 | 12/1991 | Nakagawa et al. | 257/502 |
| 5,235,201 | 8/1993 | Honna | 257/133 |
| 5,349,212 | 9/1994 | Seki | 257/133 |
| 5,488,536 | 1/1996 | Bonavia et al. | 315/209 |

FOREIGN PATENT DOCUMENTS

| | | |
|---|---|---|
| 0 208 911 | 6/1985 | European Pat. Off. . |
| 0 280 536 | 8/1988 | European Pat. Off. . |
| 0 409 010 | 1/1991 | European Pat. Off. . |
| 5-75113 | 9/1991 | Japan . |
| 4-84463 | 3/1992 | Japan . |
| 4-219978 | 8/1992 | Japan . |
| 4-318971 | 11/1992 | Japan . |

OTHER PUBLICATIONS

Patent Abstracts of Japan, vol. 17, No. 401, Jul. 27, 1993 for Japanese published Application No. 5-75113.

"Lateral Junction–Isolated Emitter Switched Thyristor", B. Jayant Baliga et al., IEEE Electron Device Letters, vol. 13, No. 12, Dec. 1992, pp. 615–617.

"High Gain Power Switching Using Field Controlled Thyristors", B.J. Baliga, Solid State Electronics, 25(5):345–353 (1982).

*Primary Examiner*—Tom Thomas
*Assistant Examiner*—Fetsum Abraham
*Attorney, Agent, or Firm*—Finnegan, Henderson, Farabow, Garrett & Dunner, L.L.P.

[57] ABSTRACT

A semiconductor device is disclosed having a thyristor region coupled to a semiconductor switching device and a semiconductor rectifier. During turn-off operation, holes are drained from the p-type base region of the thyristor region through the semiconductor rectifier and to the cathode of the thyristor. During turn-on, electrons are supplied to an n-type emitter region of the thyristor from the cathode electrode through the semiconductor switching device.

22 Claims, 39 Drawing Sheets

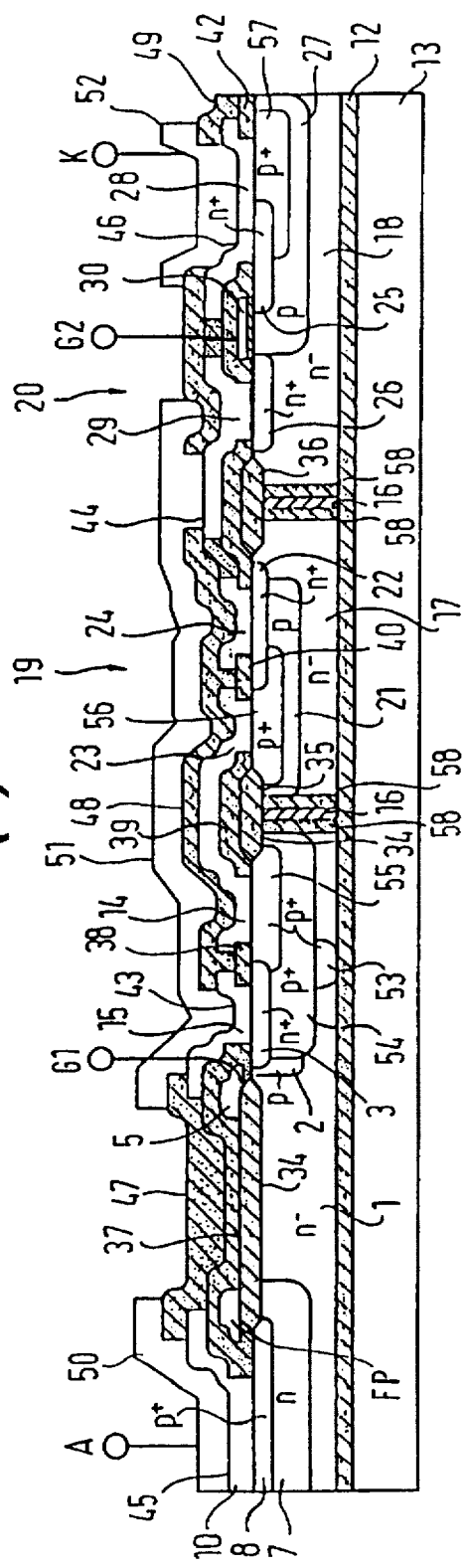
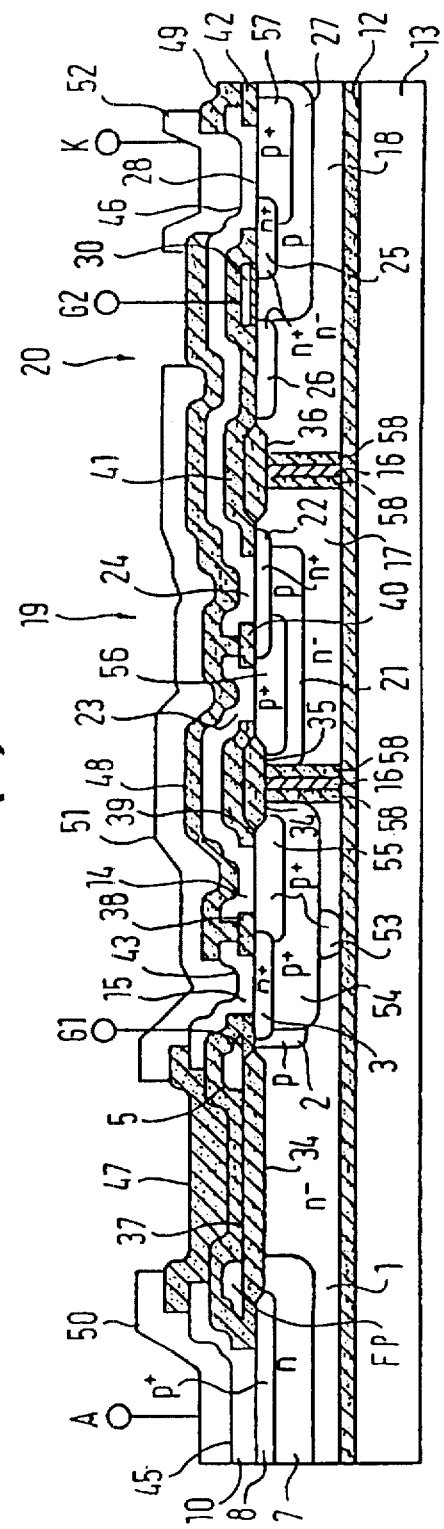

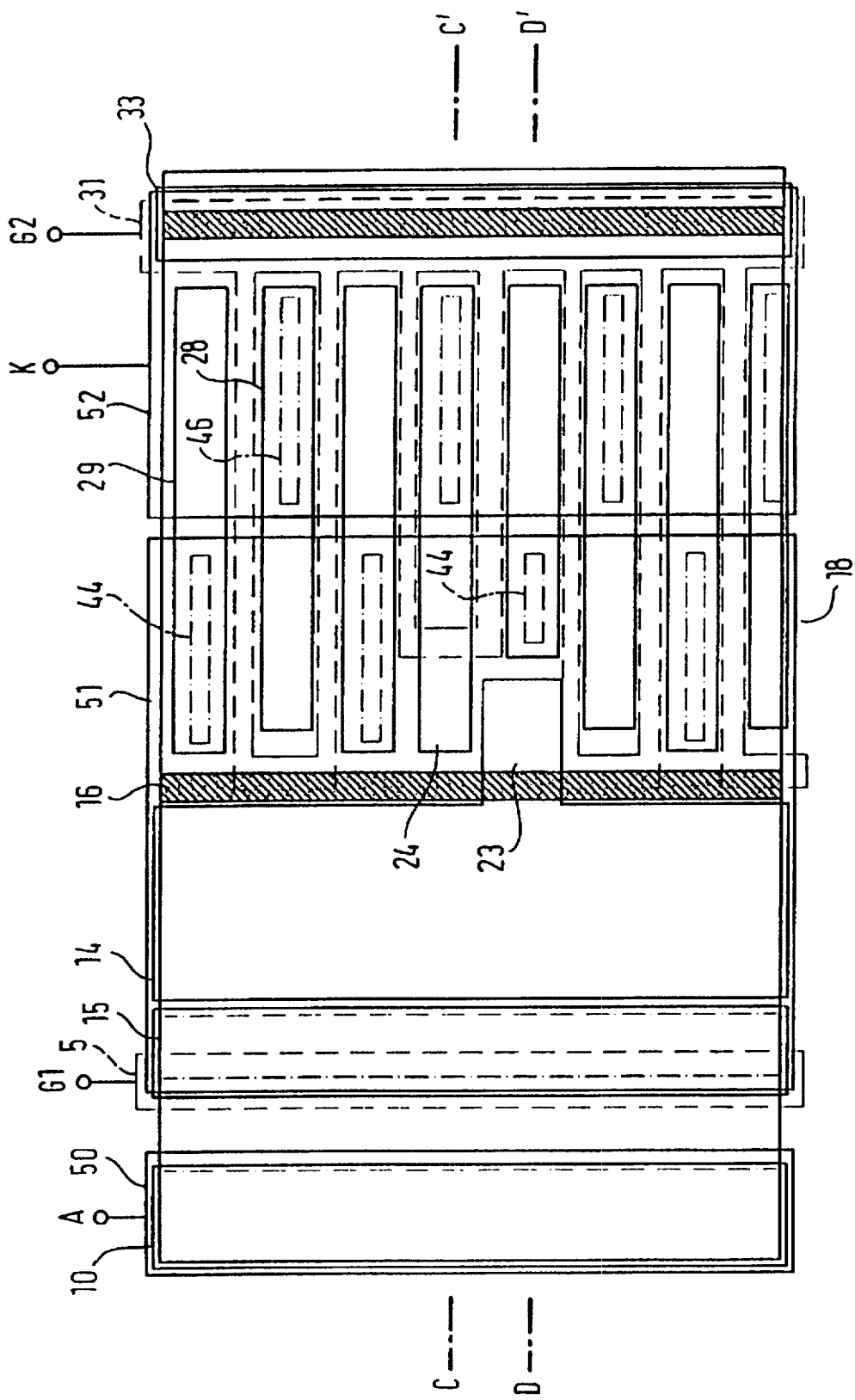

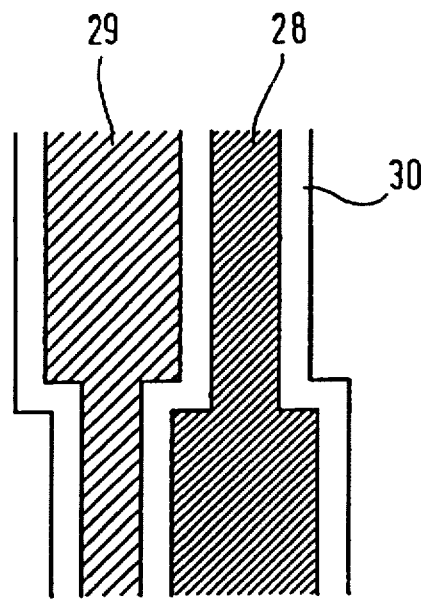
FIG. 20(a)
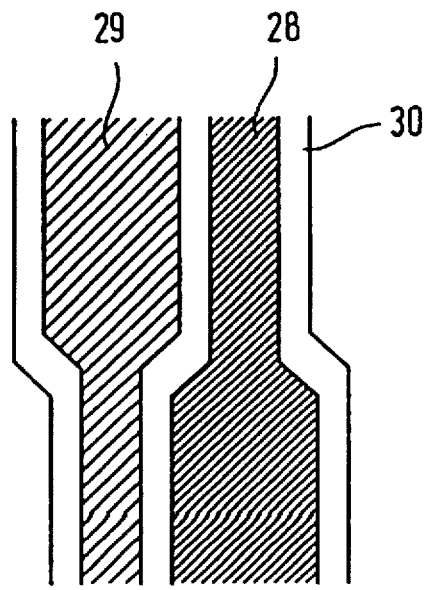
FIG. 20((b)

THYRISTOR

This application is a continuation, of application Ser. No. 08/400,980 filed Mar. 8, 1995, now abandoned.

BACKGROUND OF THE INVENTION

The present invention relates to a thyristor, in particular a voltage controlled thyristor having an insulated gate.

Insulated gate thyristors are beneficial because the gate can be driven with little current, as opposed to current driving thyristors, which require more current.

A conventional insulated gate thyristor is shown in FIG. 49, including an n-type base layer 1 provided on a p-type substrate 11. A p-type base layer 2 is formed on one surface of the n-type base layer 1. An n-type emitter layer 3 is formed in the p-type base layer 2, and a p-type emitter layer 8 is formed on the surface of the n-type base layer in n-type region 7. An n-type cathode layer 4 is formed on the surface of the p-type base layer 2 away from the n-type emitter layer 3, and a first gate electrode 5 is formed above the p-type base layer 2 between the n-type emitter layer 3 and the n-type base layer 1 on a first gate insulating film (not shown). A second gate electrode 6 is formed above the p-type base layer 2 between the n-type emitter layer 3 and the n-type cathode layer 4 on a second gate insulating film (not shown). A cathode electrode 9 is formed on the n-type cathode layer 4 and the p-type base layer 2 so that the p-type base layer 2 and the n-type cathode layer 4 are short-circuited by the cathode electrode 9. In addition, an anode electrode 10 is formed on the p-type emitter layer 8. A p$^+$-type region is also provided in p-type base layer 2.

During turn-on operation, a voltage is applied to the first (5) and second (6) gate electrodes so that channels are formed beneath the first and second gate insulated films, respectively, and electrons emitted from the n-type cathode layer 4 can be injected from the n-type emitter layer 3 into the n-type base layer 1. Simultaneously, holes are injected to the n-type base layer 1 from the p-type emitter layer 8. The injected holes, constituting a hole current, flow through the p-type base layer 2 under the n-type emitter layer and to the n-type cathode layer 4. The pn junction between the n-type emitter layer 3 and the p-type base layer 2 becomes forward biased due to the hole current in p-type base layer 2. As a result, electrons are injected from the n-type emitter layer 3 into the n-type base layer 1 and not through the channel formed between the n-type emitter layer 3 and the n-type base layer 1. Thus, the thyristor is turned on.

For proper turn-on operation, the electrical resistance of the p-type base layer 2 under the n-type emitter layer and the n-type cathode layer 4 is required to be sufficiently high so that the p-type base layer 2/n-type emitter layer 3 junction remains forward biased.

During turn-off operation, application of the voltage to the first and second gate electrodes is stopped, or a reverse voltage is applied to the gate electrodes, so that the channels disappear and the n-type emitter layer 3 is disconnected from the n-type cathode layer 4. Electron injection is then stopped. At the same time, holes accumulated in the n-type base layer 1 are drained into the cathode electrode 9 through the p-type base layer 2 under the n-type emitter layer 3. As a result, the thyristor is turned off.

However, if the electric resistance is too high in the hole path during the turn-off operation (e.g., if the length of the n-type cathode layer is too long), the n-type cathode layer 4 will be forward biased due to the hole current. Accordingly, electron injection begins again from the n-type cathode layer 4, and the thyristor will remain on, resulting in improper operation of the device.

Therefore, in view of the above-described turn-off operation, the electric resistance of the p-type base layer 2 is required to be sufficiently low. However, as noted above, a high resistance in the base layer 2 is required for proper turn-on operation. It has therefore been difficult to fabricate a thyristor having a large current-handling ability.

SUMMARY OF THE INVENTION

An object of the present invention is to provide a thyristor with an insulated gate, which can handle a large current.

The present invention provides a thyristor including a thyristor region, a semiconductor rectifier and a semiconductor switch. The thyristor region includes a first base semiconductor layer of a first conductivity type (e.g., n-type base layer), a second base semiconductor layer of a second conductivity type (e.g., p-type base layer) on the first base semiconductor layer, a first emitter semiconductor layer of the first conductivity (e.g., n-type emitter layer) on the second base semiconductor layer, and a second emitter semiconductor layer of the second conductivity type (e.g., p-type emitter layer) on the first base semiconductor layer. A first insulated gate electrode on the second base semiconductor layer is between the first emitter semiconductor layer and the first base semiconductor layer. A first electrode (e.g., anode electrode) is connected to the second emitter semiconductor layer. A second electrode (e.g., cathode electrode) is connected to the first emitter layer via the semiconductor switch such as a MOS transistor or an insulated gate bipolar transistor (IGBT) so that carriers are supplied from the second electrode to the first emitter semiconductor layer through the semiconductor switch. A semiconductor rectifier is connected between the second base semiconductor layer and the second electrode so that carriers of the second conductivity type in the second base semiconductor layer can be drained into the second electrode through the semiconductor rectifier.

The semiconductor switch may be formed in the same semiconductor layer of the first base semiconductor layer, (i.e., an active layer) and isolated from the first base semiconductor layer by an isolation region such as an insulator region. Also, the semiconductor rectifier may be formed in the active layer, and isolated from the first base layer by an isolation region.

The active layer can be disposed on an insulator surface of a substrate. For example, the active layer may be provided on an insulator or a silicon on insulator (SOI) structure produced by a direct bonding method.

The present invention further provides another thyristor including the above-mentioned thyristor portion, the first gate electrode, and the first electrode connected to the second emitter semiconductor layer. In another thyristor, the semiconductor switch is connected with the second base semiconductor layer and the second electrode so that carriers are drained from the second base semiconductor layer to the second electrode through the semiconductor switch. The semiconductor rectifier is connected with the first emitter semiconductor layer and the second electrode so that carriers are supplied to the first emitter semiconductor layer through the semiconductor rectifier.

BRIEF DESCRIPTION OF THE DRAWINGS

FIG. 9(a) is a cross-sectional view taken on line C–C' of FIG. 8;

FIG. 9(b) is a cross-sectional view taken on line D–D' of FIG. 8;

FIG. 16 is a plan view of a semiconductor device of an eighth embodiment according to the present invention;

FIGS. 20(a) and (b) are plan views of an enlarged area X in FIG. 19;

DETAILED DESCRIPTION OF THE PREFERRED EMBODIMENT

The embodiments of the present invention will be explained with reference to the drawings.

EXAMPLE 1

Figure 1:
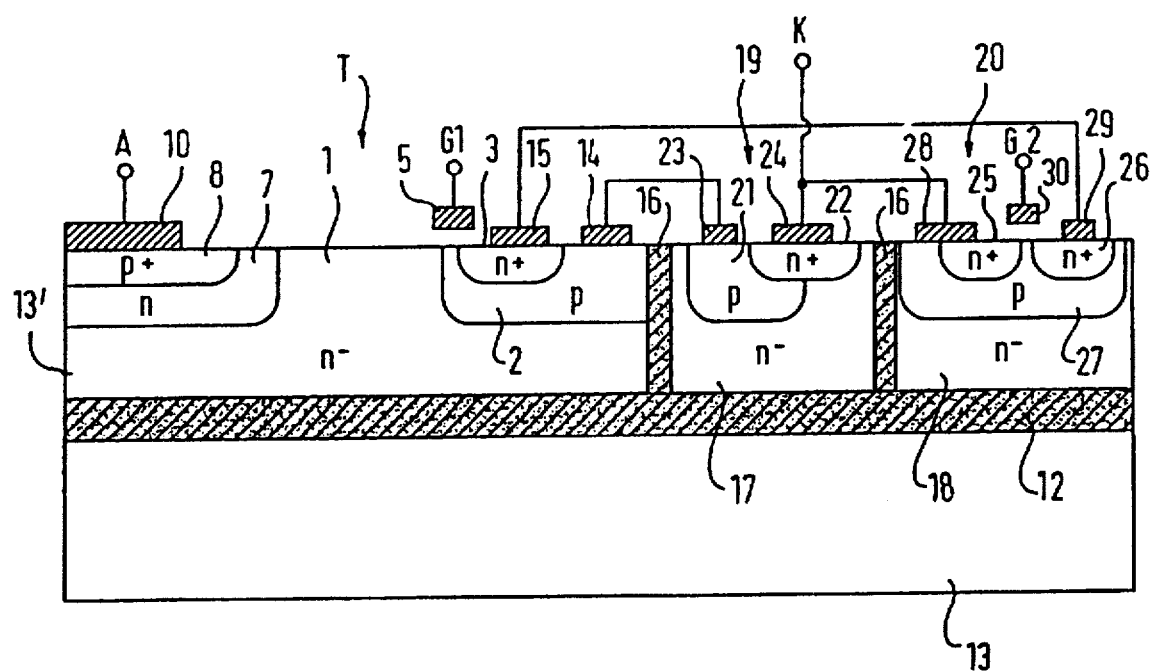
FIG. 1 is a cross-sectional view of a semiconductor device of a first embodiment according to the present invention.

FIG. 1 shows a first embodiment of a thyristor with an insulated gate according to the present invention.

An active layer 13' of $n^-$-type high-resistance semiconductor is formed on a buried insulator layer 12, preferably an oxide layer. Buried insulator layer 12 is provided on a semiconductor substrate 13, having either p or n conductivity. The thickness of active layer 13' is preferably in the range of from about 5 μm to about 15 μm so that a trench can be made readily, and the electrical resistance is sufficiently low. An n-type base layer 1 (a first base layer) of $n^-$-type semiconductor is formed in active layer 13' and may constitute part of active layer 13'. The impurity amount of n-type base layer 1 is preferably in the range of from $5\times10^{11}$ $cm^{-2}$ to about $2\times10^{12}$ $cm^{-2}$ to provide a high withstand voltage of the device. Therefore, the doping amount of active layer 13' is preferably in the same as n-type base layer or less.

A p-type base layer 2 (a second base layer) is in the surface of n-type base layer 1. The implant dosage amount of p-type base layer 2 is preferably in the range of from $10^{13}$ $cm^{-2}$ to about $2\times10^{14}$ $cm^{-2}$. The depth of p-type base layer 2 is preferably in the range of about 2 μm to about 10 μm.

A heavily doped ($n^+$) emitter layer 3 (a first emitter layer) is provided in p-type base layer 2. The implant dosage amount of n-type emitter layer 3 is preferably in the range of from $10^{15}$ $cm^{-2}$ to about $10^{16}$ $cm^{-2}$, and more preferably in the range of from about $5\times10^{15}$ $cm^{-2}$ to about $1\times10^{16}$ $cm^{-2}$. The diffusion depth of n-type emitter layer 3 is preferably in the range of about 150 nm to about 300 nm.

A first gate electrode 5 is provided on p-type base layer 2 between n-type emitter layer 3 and n-type base layer 1 via an insulator layer (not shown). First gate electrode 5 is connected to a first gate terminal (G1).

An n-type buffer layer 7 having a higher doping concentration than n-type base layer 1, is provided in n-type base layer 1 spaced from p-type base layer 2. The implant dosage amount of n-type buffer layer 7 is preferably in the range of from $5\times10^{13}$ $cm^{-2}$ to about $3\times10^{14}$ $cm^{-2}$. The diffusion depth of n-type buffer layer 7 is preferably in the range of about 2 μm to about 8 μm.

A p-type emitter layer 8 (a second emitter layer) of $p^+$-type semiconductor is formed in n-type buffer layer 7. The implant dosage amount of p-type emitter layer 8 is preferably in the range of from $10^{15}$ $cm^{-2}$ to about $10^{16}$ $cm^{-2}$, and more preferably in the range of from about $5\times10^{15}$ $cm^{-2}$ to about $1\times10^{16}$ $cm^{-2}$. The diffusion depth of p-type emitter layer 8 is preferably in the range of about 0.2 μm to about 2 μm.

An anode electrode 10 (a first electrode) is provided in ohmic contact with p-type emitter layer 8, and connected to an anode (A). An emitter electrode 15 is in ohmic contact with n-type emitter layer 3, and a base electrode 14 is in ohmic contact with p-type base layer 2.

As a result, an npnp junction device including n-type emitter layer 3, p-type base layer 2, n-type base layer 1 and n-type buffer layer 7, and p-type emitter layer 8 is formed. Thyristor operation occurs in this region (thyristor region T).

A first isolated semiconductor region 17 of active layer 13' is electrically isolated from n-type base layer 1 by an isolation region 16 formed of insulative material and pn junction diode 19 is formed within first isolated semiconductor region 17. Specifically, a p-type region 21 of p-type semiconductor and an n-type region 22 of $n^+$-type semiconductor are provided in first isolated semiconductor region 17 so as to make a pn junction. Further, a diode cathode electrode 24 is formed in ohmic contact with n-type region 22, and a diode anode electrode 23 is provided in ohmic contact with p-type region 21. Diode anode electrode 23 is connected to base electrode 14, and diode cathode electrode 24 is connected to a cathode (K).

Since p-type region 21 may be produced at the same time as p-type base layer 2, the doping amount and the depth of p-type region 21 may be the same as that of p-type base layer 2. When p-type region 21 is not formed in the same step as base layer 2, the doping amount of p-type region 21 is preferably in the range of from $10^{14}$ $cm^{-2}$ to about $2\times10^{15}$ $cm^{-2}$ and the diffusion depth of p-type region 21 is preferably in the range of about 4 μm to about 10 μm. Further, p-type region 21 may provide a low resistance layer under the diode anode electrode 23 to reduce contact resistance.

Since n-type region 22 may be produced in the same processing step as n-type emitter layer 3, the doping amount and depth of n-type region 22 may be the same as those of n-type emitter layer 3. However, when n-type region 22 is formed in a different step than emitter layer 3, the implant dosage amount of n-type region 22 is preferably set in the range of from $10^{15}$ $cm^{-2}$ to about $2\times10$ $cm^{-2}$, and the diffusion depth of n-type region 22 is preferably in the range of about 0.15 μm to about 2 μm.

A second isolated semiconductor region 18 of active layer 13' is electrically isolated from n-type base layer 1 by an isolation region 16, preferably made of an insulative material. Second isolated semiconductor region 18 includes an MOS transistor 20. MOS transistor 20 is provided in a p-type well 27. MOS transistor 20 includes $n^+$-type source and drains regions 25 and 26, respectively, spaced from each other in p-type well 27. A second gate electrode 30 is formed on an insulator (not shown) above on p-type well 27 between n-type source and drains region 25 and 26. Second gate electrode 30 is connected to a second gate terminal (G2).

A drain electrode 29 is in electrical contact with n-type drain region 26, and electrically connected to emitter electrode 15. A source electrode is in electrical contact with n-type source region 25 and p-type well 27, and electrically connected to diode cathode electrode 24.

Since p-type well 27 may be produced at the same time as p-type base layer 2, the doping amount and the depth of p-type well 27 may be the same as those of p-type base layer 2. When p-type well 27 is formed during a different processing step than base layer 2, the doping amount of p-type well 27 is preferably in the range of from $3\times10^{12}$ $cm^{-2}$ to about $3\times10^{14}$ $cm^{-2}$ and the diffusion depth of p-type well 21 is preferably in the range of about 1 μto about 4 μm.

Since n-type source region 25 and drain region 26 may be produced at the same time as n-type emitter layer 3, the doping amount and the depth of n-type source region 25 and drain region 26 may be the same as those of n-type emitter layer 3.

In Example 1, diode 17 and MOS transistor 18 are preferably isolated by isolation region 16. However, it is not necessary for these devices to be electrically isolated from one another but can be formed in a single semiconductor body which is itself isolated from thyristor region T.

Turn-on operation of the thyristor in accordance with the present invention will now be described.

While a positive voltage with respect to cathode (K) is applied to anode (A), a positive voltage with respect to cathode (K) is applied to first and second gate terminals G1 and G2, respectively. Since n-type channels appear under first and second gate electrodes 5 and 30, respectively, electrons are injected into n-type base layer 1 from n-type emitter layer 3 and holes are injected into n-type base layer 1 from p-type emitter layer 8. The holes are then drained into base electrode 14 through p-type base layer 2.

The electric potential of p-type base layer 2 under n-type emitter layer 3 is raised due to a voltage drop caused by the electric resistance of p-type base layer 2 and the built-in voltage of pn junction diode 19. Therefore, the pn junction between n-type emitter layer 3 and p-type base layer 2 is forward biased and electrons are injected from n-type emitter layer 3 into n-type base layer 1 not through the n-type channel under first gate electrode 5.

The device therefore remains in an on-state even without application of the voltage to first gate terminal (G1). Only application of voltage to second gate terminal (G2) is necessary for the device to remain on.

Turn-off operation of the thyristor in accordance with the present invention will now be discussed.

A negative voltage with respect to cathode (K) or zero voltage is applied to second gate terminal G2 so that the n-type channel under second gate electrode 30 disappears. As a result, supply of electrons from cathode (K) to n-type emitter layer 3 stops and holes accumulated in n-type base layer 1 are drained into base electrode 14 through p-type base layer 2.

Approximately the same voltage between base electrode 14 and cathode (K) is applied to n-type drain region 26. However, since the forward electrical resistance of pn junction diode 19 is small even if large current flows, the voltage applied to n-type drain region 26 is sufficiently small so that MOS transistor 20 does not break down. As a result, the turn-off capability is improved, i.e., a large current can be handled.

Further, since MOS transistor 20 is isolated from n-type base layer 1, there is no parasitic thyristor, i.e., electrons are injected into n-type base layer 1 only from n-type emitter layer 3. Therefore, unintentional thyristor operation does not occur.

During turn-on operation, the built-in voltage of pn junction diode 19 makes turn-on operation easy, while, during turn-off operation, the small electric resistance of pn junction diode 19 increases the turn-off capability.

Figure 2:
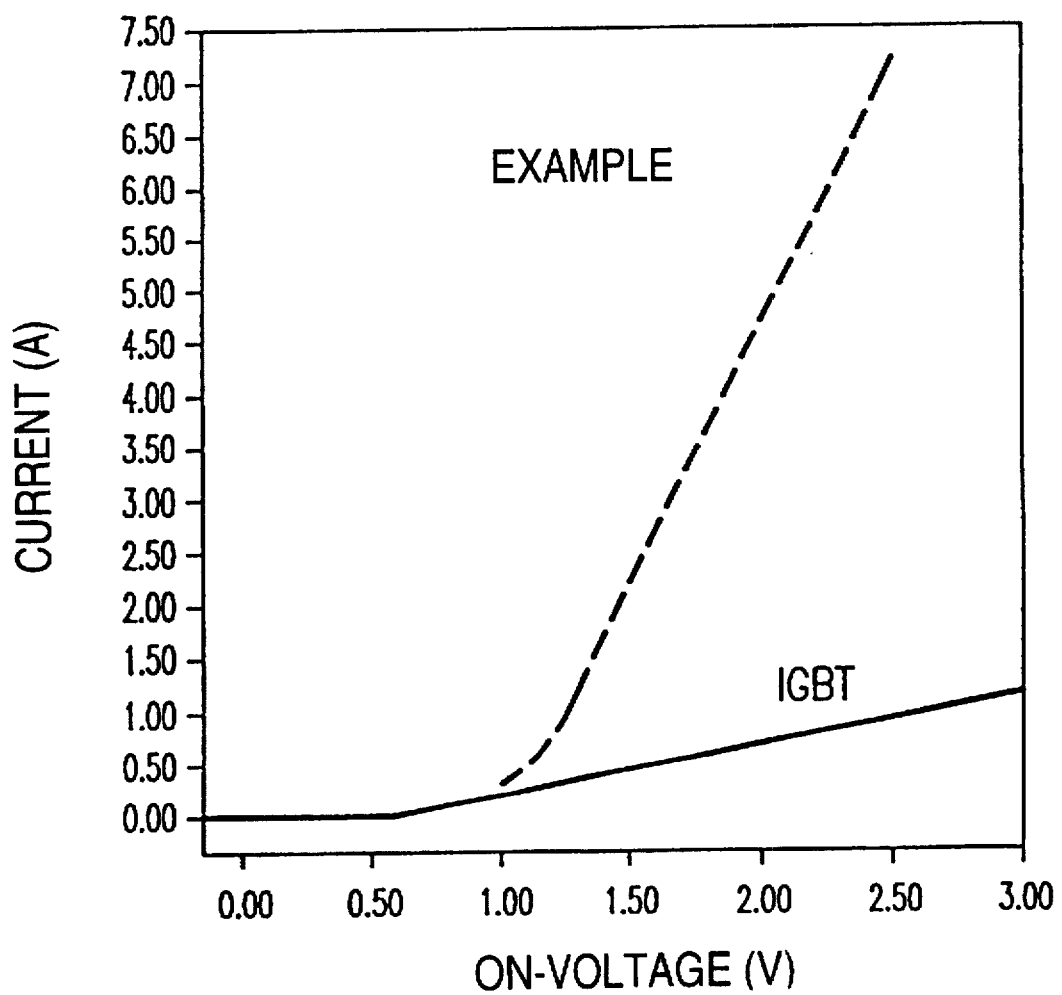
FIG. 2 is a graph showing the relation between on-voltage and current of the first embodiment.

FIG. 2 is a graph showing a simulated voltage-current characteristic of a thyristor according to Example 1 (a broken line). A voltage-current property of a conventional IGBT (insulated gate bipolar transistor) is also shown in FIG. 2 (a continuous line). The thyristor according to the present invention can obtain about six times as much current as the conventional IGBT at about 2 V of on-voltage.

Figure 3:
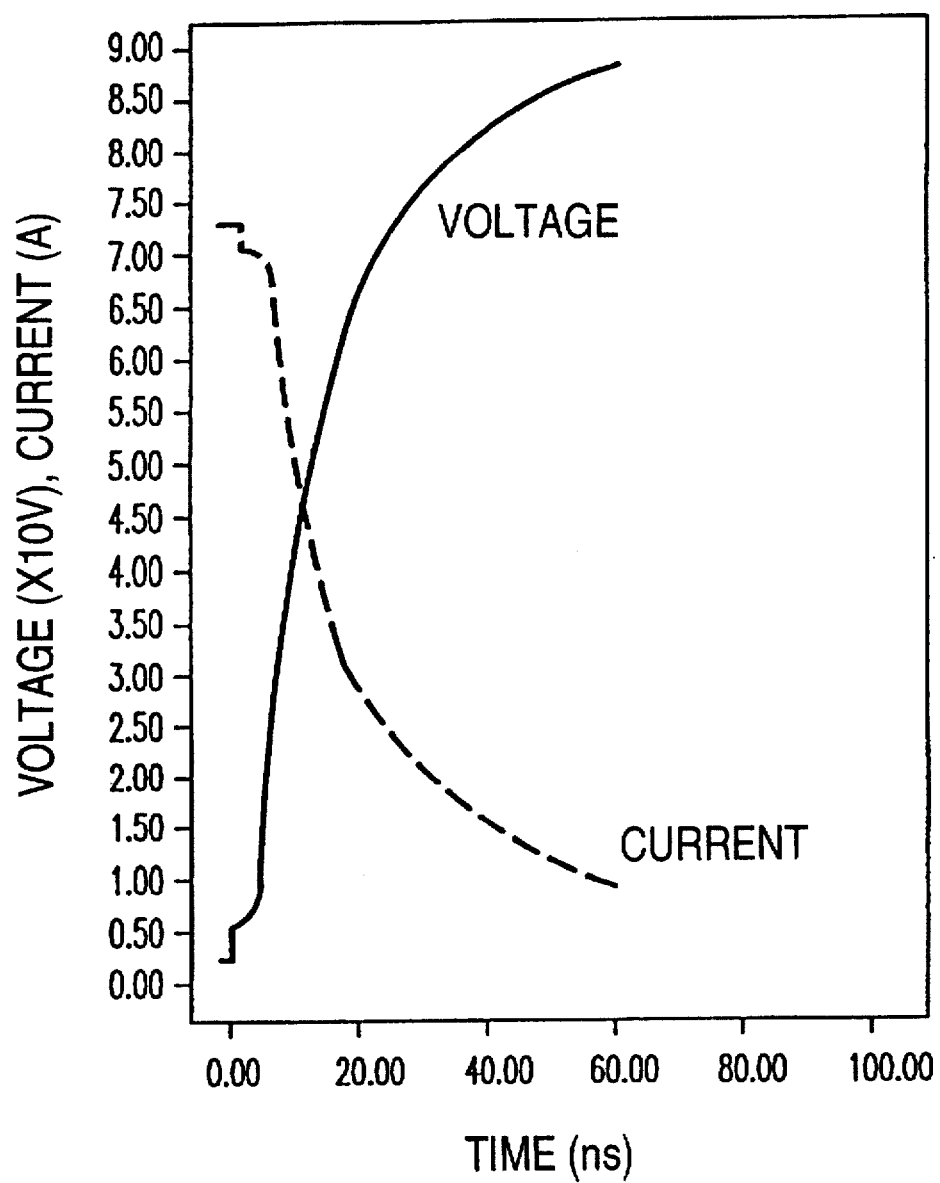
FIG. 3 is a graph showing the relation between time and both current and voltage of the first embodiment during turn-off operation.

FIG. 3 is a graph showing a simulated turn-off property of a thyristor according to Example 1, wherein an on-voltage is 2.5 V, an initial current is about 7 A, A-K voltage is 100 V and a carrier life time in n-type base layer 1 is about 1 usec. The broken line in FIG. 3 corresponds to current and the continuous line corresponds to voltage. Turn-off time is about 100 nsec in this example.

It is within the scope of this invention that the conductivities of the various semiconductor regions of Example 1 shown in FIG. 1 may be switched. In which case, a MOS transistor 20 is provided between an anode electrode (A) and a p-type emitter layer 8, a pn junction diode 19 is provided between an anode electrode (A), and an n-type buffer layer 7.

EXAMPLE 2

Figure 4:
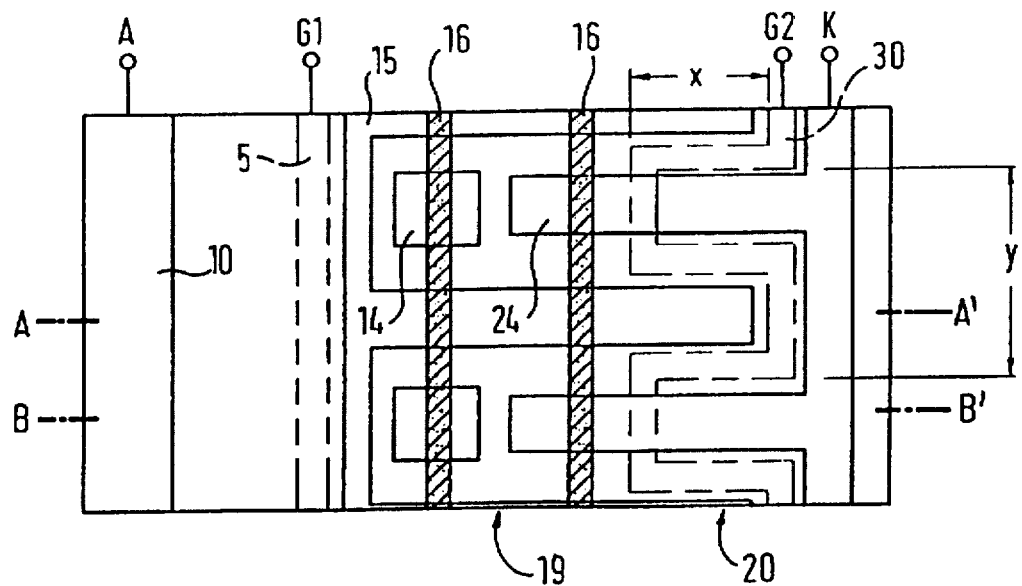
FIG. 4 is a plan view of a semiconductor device of a second embodiment according to the present invention.
Figure 5A:
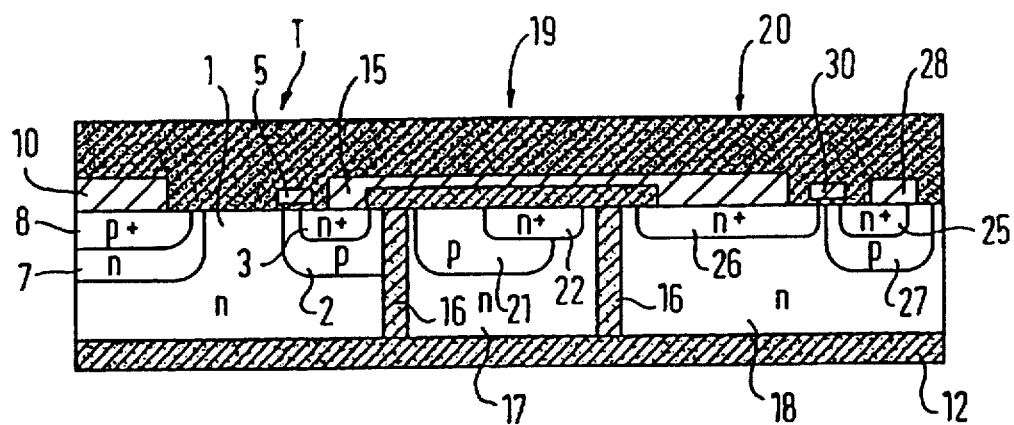
FIG. 5(a) is a cross-sectional view taken on line A–A' of FIG. 4.
Figure 5B:
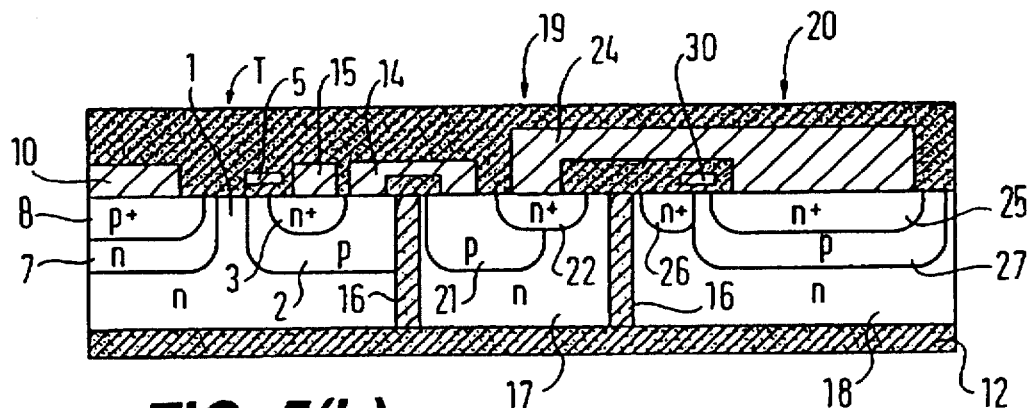
FIG. 5(b) is a cross-sectional view taken on line B–B' of FIG. 4.

Example 2 is a modification of Example 1 and illustrates an example of electric wiring of the thyristor. FIG. 4 shows a plan view or layout of the second embodiment of a thyristor with an insulated gate according to the present invention and FIG. 5(a) is a cross-sectional view taken along line A–A' of FIG. 4. FIG. 5(b) is a cross-sectional view taken along line B–B' of FIG. 4. In FIGS. 5(a) and (b), substrate 13 is not shown. The device structure and the operation are substantially the same as Example 1. Therefore, the same reference numerals are used to indicate the same components as in FIG. 1 and duplicate explanation will be omitted.

In the second embodiment, thyristor portion T and pn junction diode 19 is the same as Example 1. Concerning MOS transistor 20, n-type drain region 26 is outside p-type well 27. However, n-type drain region 26 may be inside of p-type well 27 as in Example 1. The n-type source region 25 and n-type drain 26 have a complementary comb-shaped structure and meet each other so that second gate electrode 30 is disposed in a zigzag between source and drain regions 25 and 26, respectively. Further, diode cathode electrode 24 and emitter electrode 15 are comb-shaped and meet each other so that current flow is substantially the same throughout the device.

Since an increase in the electrical resistance of MOS transistor 20, i.e., resistance at the channel, increases the electric resistance of the thyristor during the on-state, the resistance of MOS transistor 20 should preferably be small. In Example 2, the width of the channel of MOS transistor 20 is long due to the zigzag shape of second gate electrode 30. Therefore, the resistance of MOS transistor 20 is small and the resistance of the thyristor is also small during the on-state. Further, the width can be lengthened by lengthening the portion "x" of the zigzag or increasing the turns of the zigzag by shortening the pitch "y" of the zigzag.

EXAMPLE 3

Figure 6:
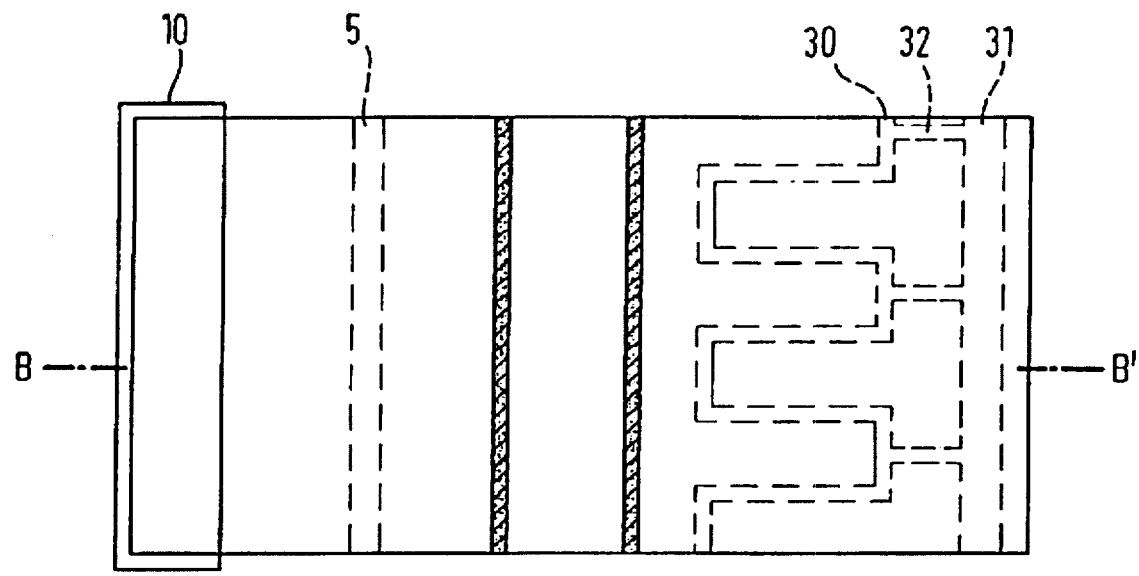
FIG. 6 is a plan view of a semiconductor device of a third embodiment according to the present invention.
Figure 7:
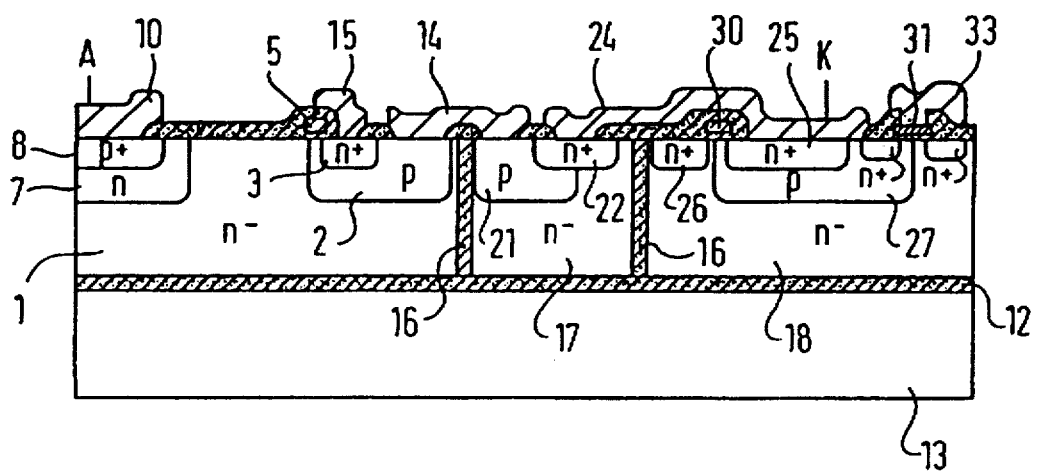
FIG. 7 is a cross-sectional view taken on line B–B' of FIG. 6.

Example 3 is a modification of Example 2 and shows another example of electric wiring of the thyristor. FIG. 6 shows a plan view of a third embodiment of a thyristor with an insulated gate according to the present invention. FIG. 7 is a cross-sectional view taken along line B–B' of FIG. 6. The device structure and the operation are substantially the same as Example 2. Therefore, the same reference numerals are used to indicate the same components as in FIG. 1 and duplicate explanation will be omitted.

Since Example 2 has a long gate length of MOS transistor 20, second gate electrode 30 has a large electric resistance and capacitance. Therefore, the current in MOS transistor 20 might not flow equally, because some portions of MOS transistor 20 may turn off before others.

Example 3 provides a bypass electrode 31 such as a polysilicon layer along second gate electrode 30. Bypass electrode 31 is connected with second gate electrode 30 at a plurality of locations 32. Since a gate signal can be supplied through bypass electrode 31 to second gate electrode 30, current flow evenly in MOS transistor 20 beneath the entire gate. Further, to obtain lower electrical resistance, it is preferably that a metal electrode 33 such as Al is provided on bypass electrode 31. Alternatively, low electric resistance can be obtained by forming bypass electrode 31 and metal electrode 33 of silicides or polycides.

EXAMPLE 4

Figure 8:
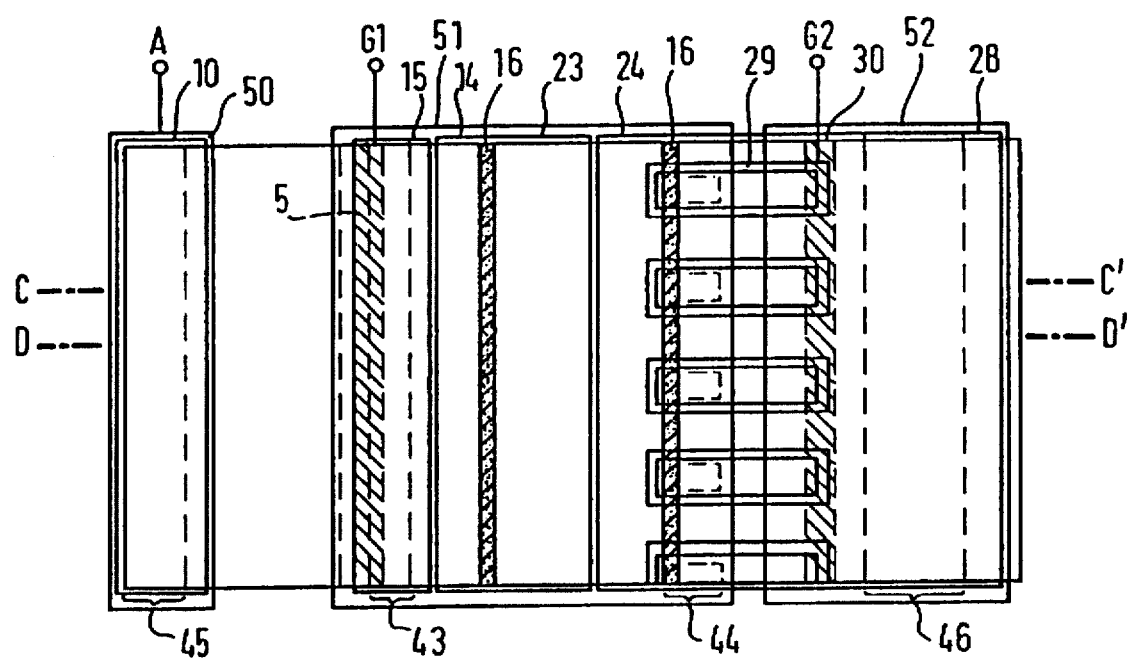
FIG. 8 is a plan view of a semiconductor device of a fourth embodiment according to the present invention.

Example 4 is a fourth embodiment of the present invention and a modification of Example 1. The thyristor of Example 4 has a two layer electric wiring. The device structure and the operation are substantially the same as Example 1. Therefore, the same reference numerals are used to indicate the same components as in FIG. 1 and duplicate explanation will be omitted. FIG. 8 shows a plan view of a thyristor of Example 4. FIG. 9(a) is a cross-sectional view taken along line C–C' of FIG. 8 and FIG. 9(b) is a cross-sectional view taken along line D–D' of FIG. 8.

The thyristor of Example 4 provides $p^+$ contact layers 55 to 57 under a base electrode 14, a diode anode electrode 23 and source electrode 28, respectively, so as to obtain good ohmic contact.

Further, the thyristor of Example 4 provides a first $p^+$ layer 53 and a second $p^+$ layer 54 overlapped with a p-type base layer 2. First $p^+$ layer 53 is preferably deeper than layers 54 and 2. Layers 53 and 54 are preferably deeper than p-type base layer 2. With this structure, holes in n-type base layer 1 can be easily drained into base electrode 14 during turn-off operation. Therefore, during turn-off operation, the amount of potential increase in p-type base layer 2 is less than a structure which does not provide first and second $p^+$ layer 53 and 54. As a result, a large current can be turned off. For example, the depth of first $p^+$ layer 53 is about 10 µm and the depth of second $p^+$ layer 54 is about 5 µm.

FIGS. 10(a) to (i) show sectional views at different phases of a process for producing the device shown in Example 4.

Figure 10A:
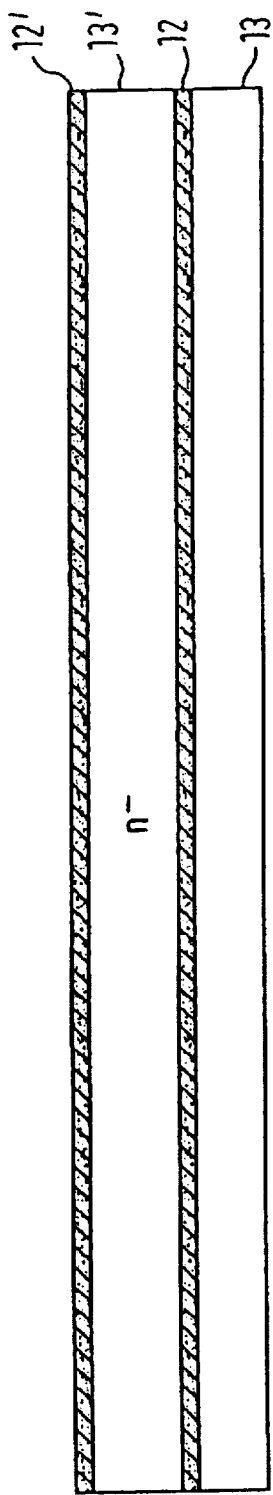
FIGS. 10(a)–(i) are cross-sectional views of the semiconductor device at different phases of a process of producing the devices of the fourth embodiment.
Figure 10B:
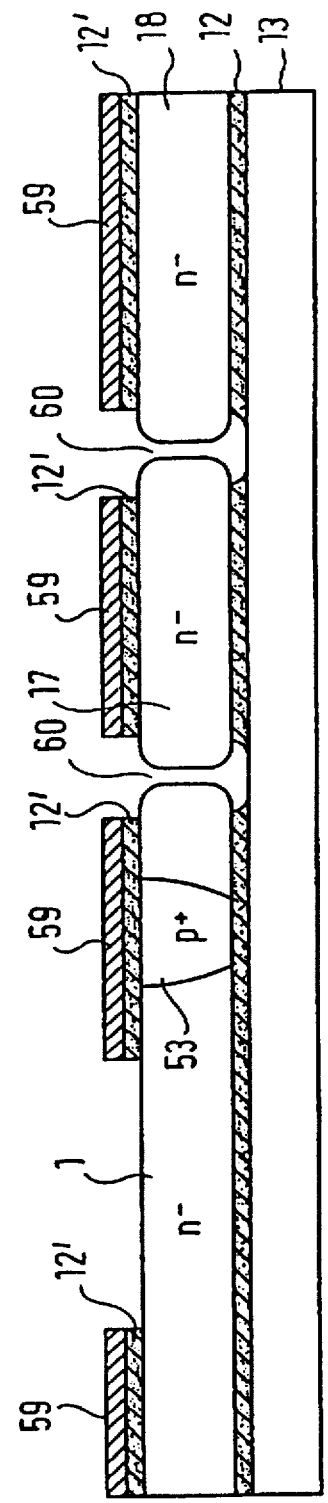

As seen in FIG. 10(a), two silicon wafers are bonded to obtain an active layer 13' on a substrate 13 via a buried insulator layer 12. For example, after a surface of a silicon wafer W1 to become active layer 13' is oxidized, the one silicon wafer is directly bonded with another silicon wafer W2 so that the oxidized surface is between two silicon wafers. Silicon wafer W2 may also have an oxidized surface. After that, silicon wafer W1 is ground to obtain a predetermined thickness equal to that of active layer 13'. A dose amount of impurities in active layer 13' is preferably about $1\times10^{12}$ cm$^{-2}$. Therefore, a silicon wafer having that impurity amount may be used as silicon wafer W1. Moreover, a silicon wafer having a lower impurity amount may be used and the impurity amount of active layer 13' can be adjusted by, for example, ion implantation. After bonding, active layer 13' is covered with an insulator layer 12' of $SiO_2$ (FIG. 10(a)).

A first $p^+$ layer 53 is formed in a region where n-type base layer 1 will be formed by, for example, implantation and diffusion of $B^+$ ions. The implant dosage amount of first p+layer 53 is preferably in the range of from $1\times10^{15}$ cm–2 to about $5\times10^{15}$ cm$^{-2}$ and the diffusion depth of first $p^+$ layer 53 is preferably in the range of about 5 µm to about 10 µm. An SiN layer 59 is formed on insulator layer 12' by, for example, an LPCVD (low pressure chemical vapor deposition) method. Trenches 60 are formed in active layer 13' so that active layer 13' is divided into n-type base layer 1 (a first base layer), a first isolated semiconductor region 17 and a second isolated semiconductor region 18 by, for example, an RIE method. SiN layer 59 is patterned so as to be a mask during the next oxidation (FIG. 10(b)).

Figure 10C:
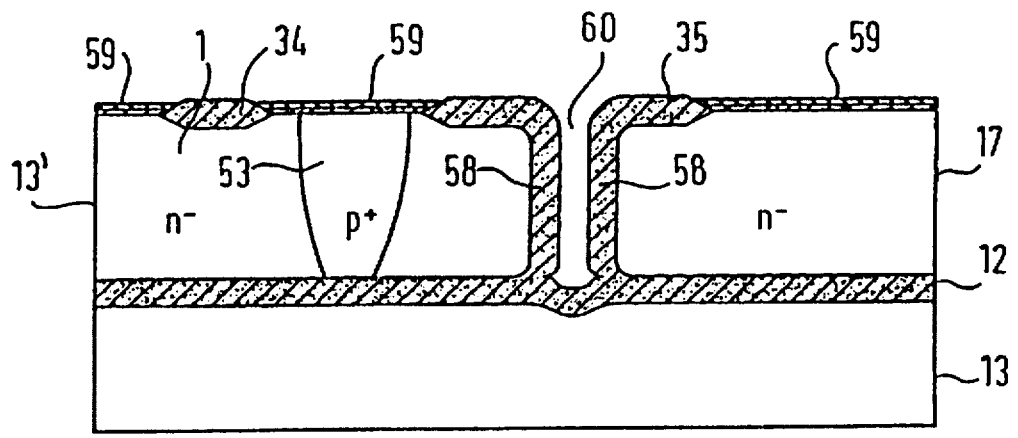

Oxide layers 34–36 are formed at a surface of n-type base layer 1 not covered with SiN layer 59 by selective oxidation with the mask of SiN layer 59 (FIG. 10(c)). Oxide layer 36 is not shown in FIG. 10(c). An oxide layer 58 is also formed on the surface of trench 60.

Figure 10D:
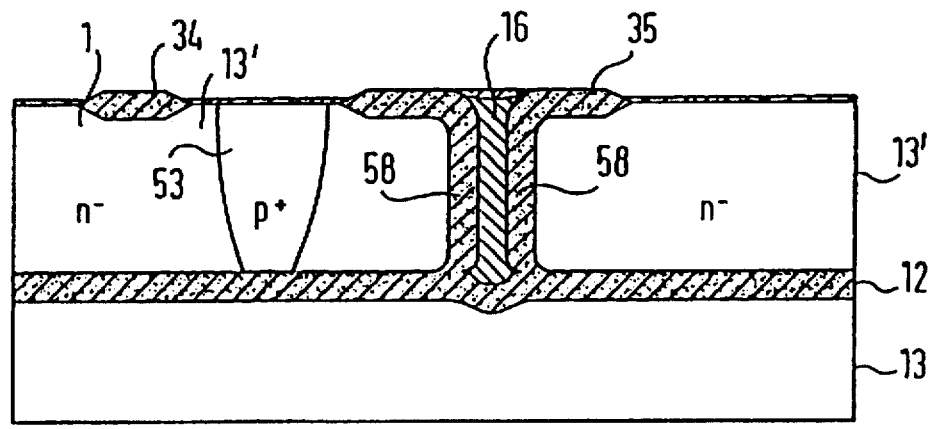

After removing SiN layer 59, trench 60 is filled with polysilicon by an LPCVD method and excess polysilicon is etched back by, for example, a CDE (chemical dry etching) method or polishing (FIG. 10(d)). After that, the surface of polysilicon in trench 60 is oxidized to complete an isolation region 16. Polysilicon in trench 60 may be replaced with silicon oxide, for example, formed by a CVD (chemical vapor deposition) method.

Figure 10E:
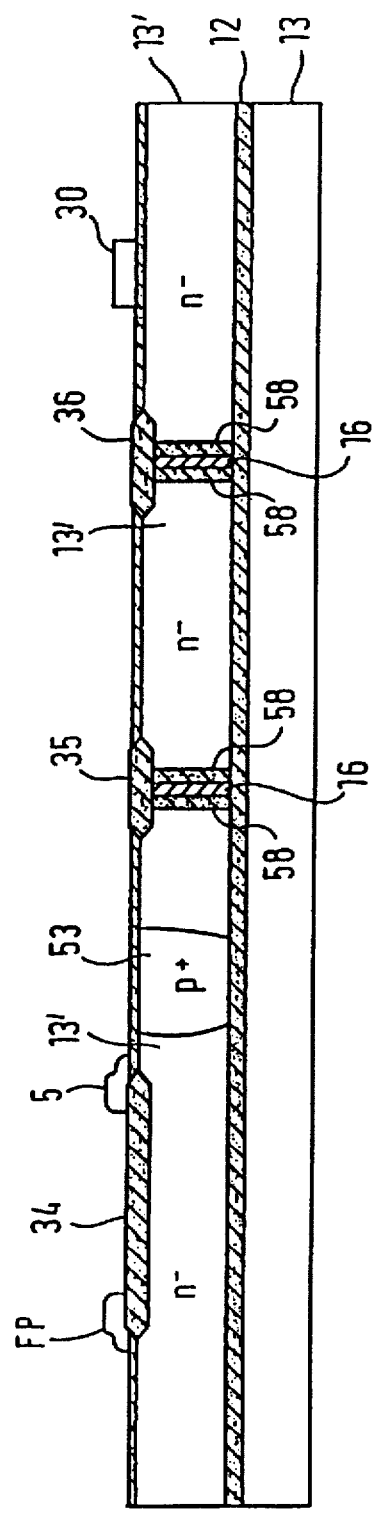
Figure 10F:
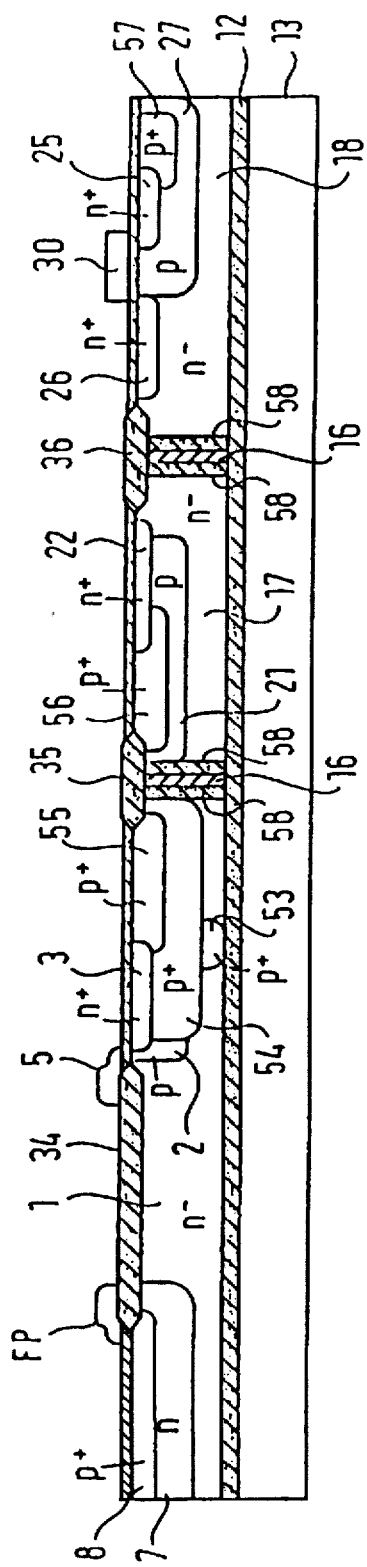
Figure 10G:
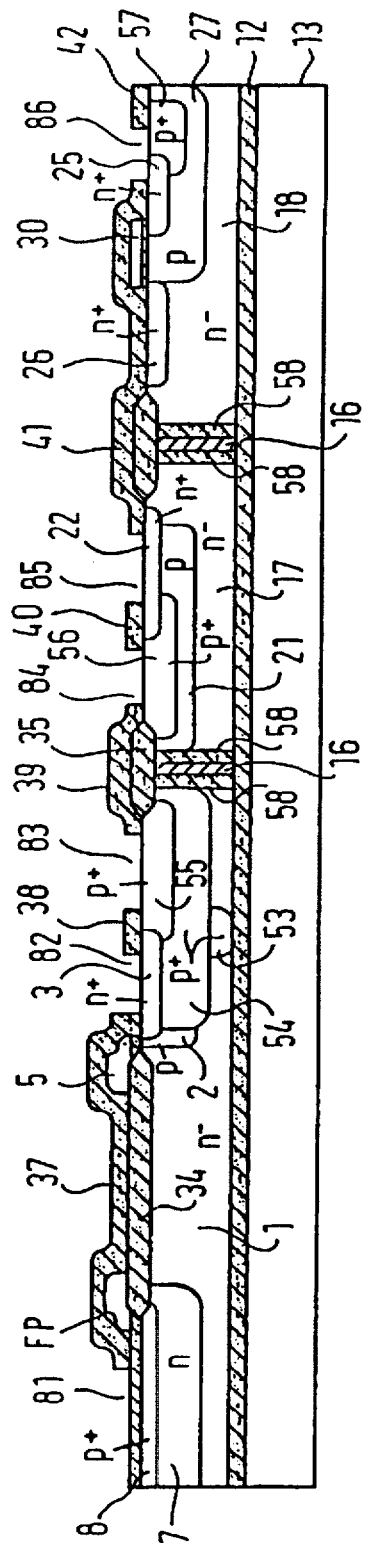

A first gate electrode 5 and a second gate electrode 30 of polysilicon are formed at a predetermined place (FIG. 10(e)). Electrodes 5 and 30 may be formed by patterning with an RIE or CDE method after depositing with an LPCVD method. A field plate (FP) of polysilicon is formed on oxide layers 34 over a position where an n-type buffer layer 7 will be formed. Field plate (FP) may be of a metal such as Al. Field plate (FP) will electrically connect an anode electrode so that the electric potential of field plate (FP) will be the same as the electric potential of anode electrode 10. The length of the field plate (FP) may be the same as the depth of n-type buffer layer 7 and less than three times of the depth of n-type buffer layer 7.

Then, an n-type emitter layer 3, an n-type buffer layer 7, an n-type region 22, an n-type source region 25, and an n-type drain region 26 are formed by implantation and diffusion of $P^+$ ions. Also, a p-type base layer 2, a p-type emitter layer 8, a p-type region 21, a p-type well 27, and $p^+$ contact layers 55 to 57 are formed by implantation and diffusion of $B^+$ ions (FIG. 10(f)). The doping amount of $p^+$ contact layers 55 to 57 is preferably in the range of from $10^{15}$ cm$^{-2}$ to about $10^{16}$ cm$^{-2}$, more preferably in the range of from about $5\times10$ cm$^{-2}$ to about $1\times10^{16}$ cm$^{-2}$. The diffusion depth of $p^+$ contact layers 55 to 57 is preferably in the range of about 0.2 µm to about 2 µm.

In this example, the diffusion or doped layers and gate electrodes 5 and 30 are formed after forming trenches 60. However, trenches 60 may be formed after forming the doped layers and gate electrodes.

An $SiO_2$ layer, a BPSG (boron phosphorus silicate glass) layer and a PSG (phosphorus silicate glass) layer are then deposited on active layer 13' sequentially and melted so as to obtain a smooth surface of oxide layers 37 to 42. Then, contact holes 81 to 86 are formed by an RIE method (FIG. 10(g)).

Figure 10H:
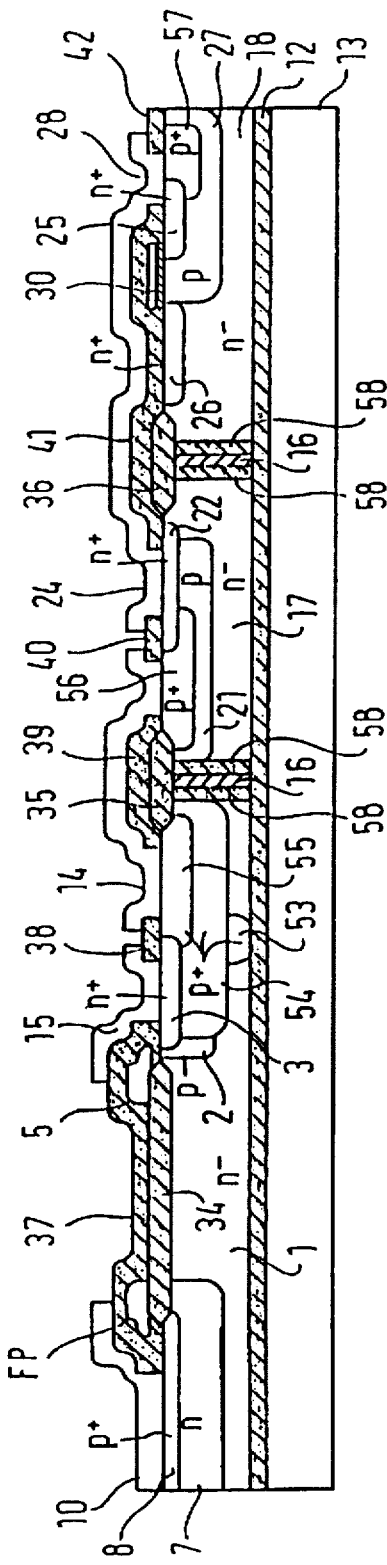
Figure 10I:
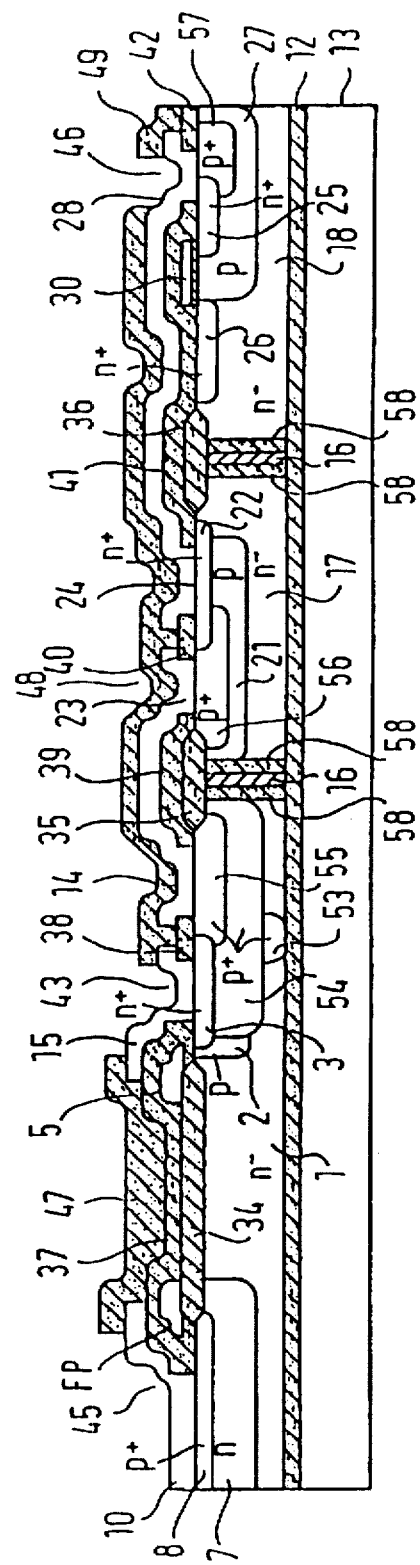

After that, a lower electric wiring layer of Al is formed by a sputtering method and an RIE method so as to obtain electrodes 10, 14, 15, 23, 24, 28, and 29 (FIG. 10(h)).

Then, an $SiO_2$ layer is deposited on the first electric wiring layer by a plasma CVD method or a bias sputtering method. After that, through holes 43, 44, 45, and 46 are formed by an RIE method (FIG. 10(i)). Through hole 45 corresponds to an anode electrode 10, through hole 43 corresponds to emitter electrode 15, and through hole 46 corresponds to source electrode 28. Through holes 43, 45, and 46 are strip-shaped, while holes 44 (not shown in FIG. 10(i)) include plural islands arranged in a line and corresponding to drain electrode 29 (FIGS. 8, 9(a) and (b)).

Then, an upper electric wiring layer of Al is formed by a sputtering method, and an RIE method or wet etching, so as to obtain electrodes 50, 51, and 52 (FIG. 9(b)). Electrode 50 corresponds to anode (A) and electrode 52 corresponds to cathode (K). Electrode 51 connects emitter electrode 15 and drain electrode 29.

In Example 4, since the lower electric wiring layer has a finer pattern than the upper electric wiring layer, the lower electric wiring layer is thinner than the upper electric wiring layer.

Lastly, a passivation oxide layer (not shown) is provided which covers the surface of the device.

Since Example 4 provides plural wiring layers, low resistance can be obtained while holes are drained during turn-off of the thyristor according to the present invention.

EXAMPLE 5

Figure 11:
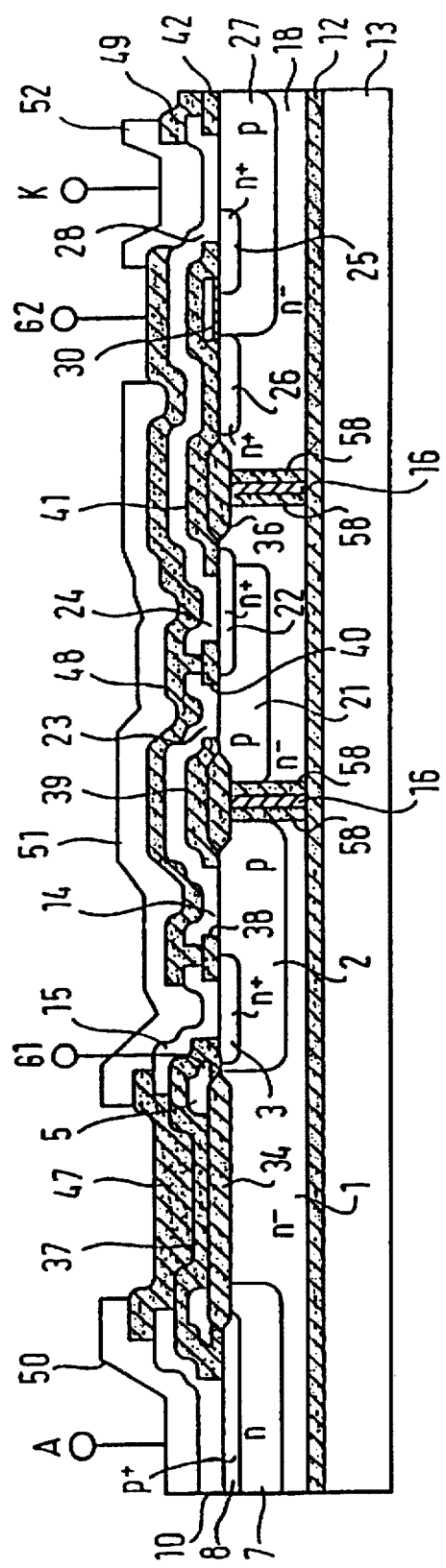
FIG. 11 is a cross-sectional view of a fifth embodiment according to the present invention.

FIG. 11 shows a thyristor of a fifth embodiment according to the present invention. This embodiment is substantially the same as the thyristor in FIG. 9(b) except it includes a first $p^+$ layer 53, second $p^+$ layer 54, and $p^+$ contact layers 55 to 57. In Example 4, first $p^+$ layer 53 preferably reaches buried insulator layer 12 but this is not necessary for proper device operation. Also, second $p^+$ layer 54 and $p^+$ preferably contact layers 55 to 57 are not necessarily required.

EXAMPLE 6

Figure 12:
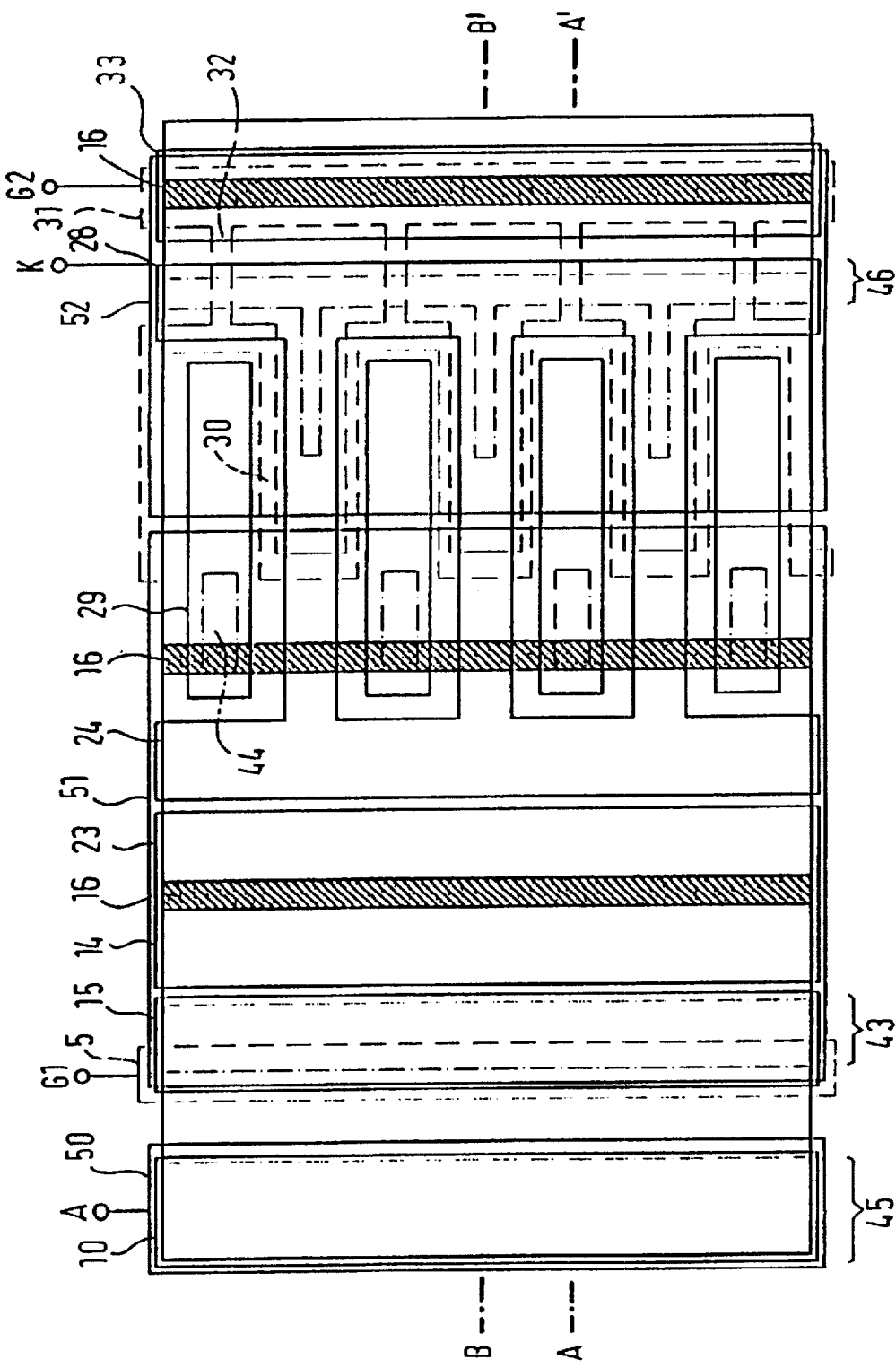
FIG. 12 is a plan view of a semiconductor device of a sixth embodiment according to the present invention.
Figure 13A:
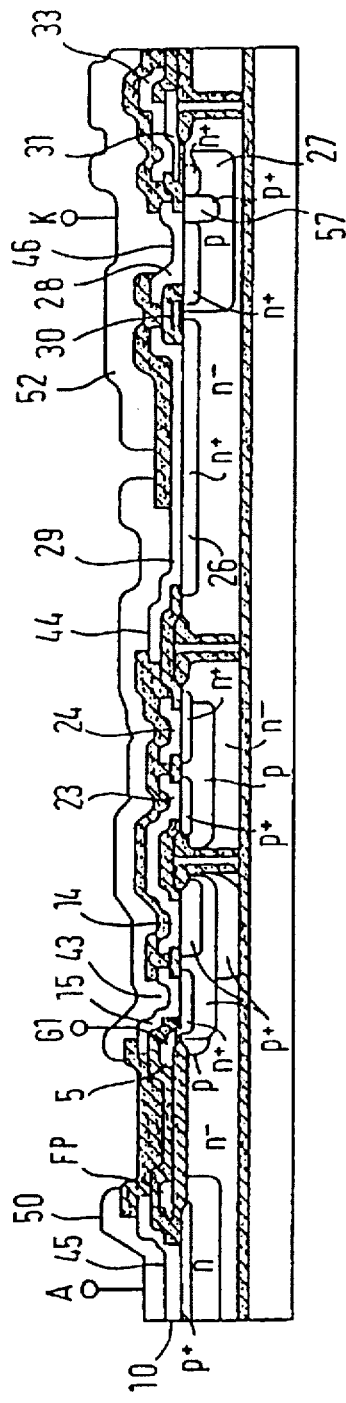
FIG. 13(a) is a cross-sectional view taken on line A–A' of FIG. 12.
Figure 13B:
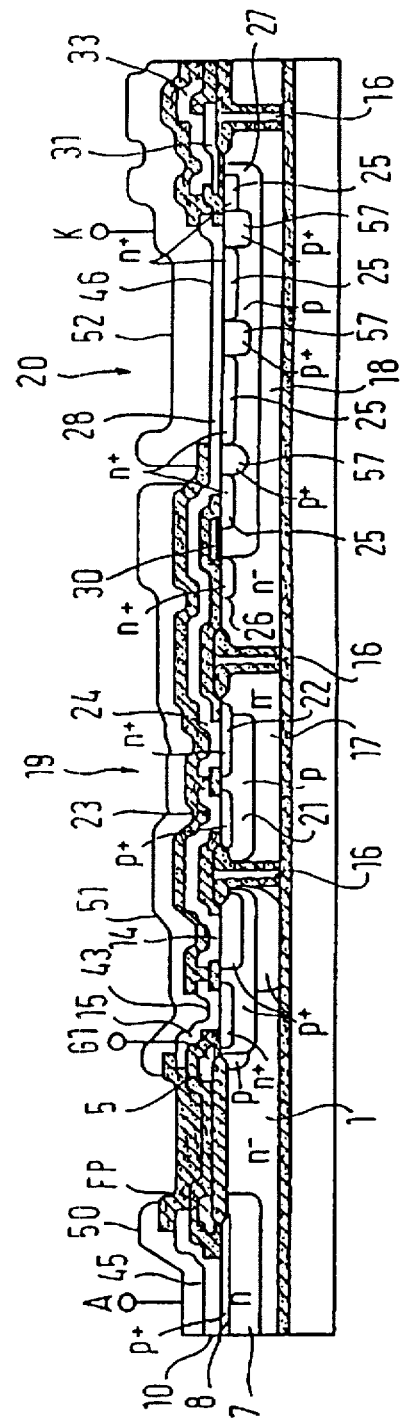
FIG. 13(b) is a cross-sectional view taken on line B–B' of FIG. 12.

Example 6 is a sixth embodiment according to the present invention and a modification of Example 4. The thyristor of Example 6 has a zigzag shaped gate electrode 30 of MOS transistor 20. FIG. 12 shows a plan view of a thyristor with an insulated gate of Example 6 according to the present invention. FIG. 13(a) is a cross-sectional view taken along line A–A' of FIG. 12 and FIG. 13(b) is a cross-sectional view taken along line B–B' of FIG. 12. The device structure and the operation are substantially the same as Examples 1, 2 and 4. Therefore, the same reference numerals are used to indicate the same components as in FIGS. 1, 3(a), 3(b), 6, 7(a) and 7(b), and duplicate explanation will be omitted.

The thyristor portion in FIGS. 13(a) and (b) is substantially the same as that in Example 4. In addition, the pn junction diode 19 is substantially the same as that in Example 1 with the exception that an n-type region 22 is formed within a p-type region 21. An MOS transistor 20 is substantially the same as Example 2 except that plural $p^+$ contact layers 57 are formed in p-type well 27 so as to contact a source electrode 28 in order to stabilize the potential of p-type well 27. Further, an n-type drain region 26 is preferably placed within p-type well 27.

EXAMPLE 7

Figure 14:
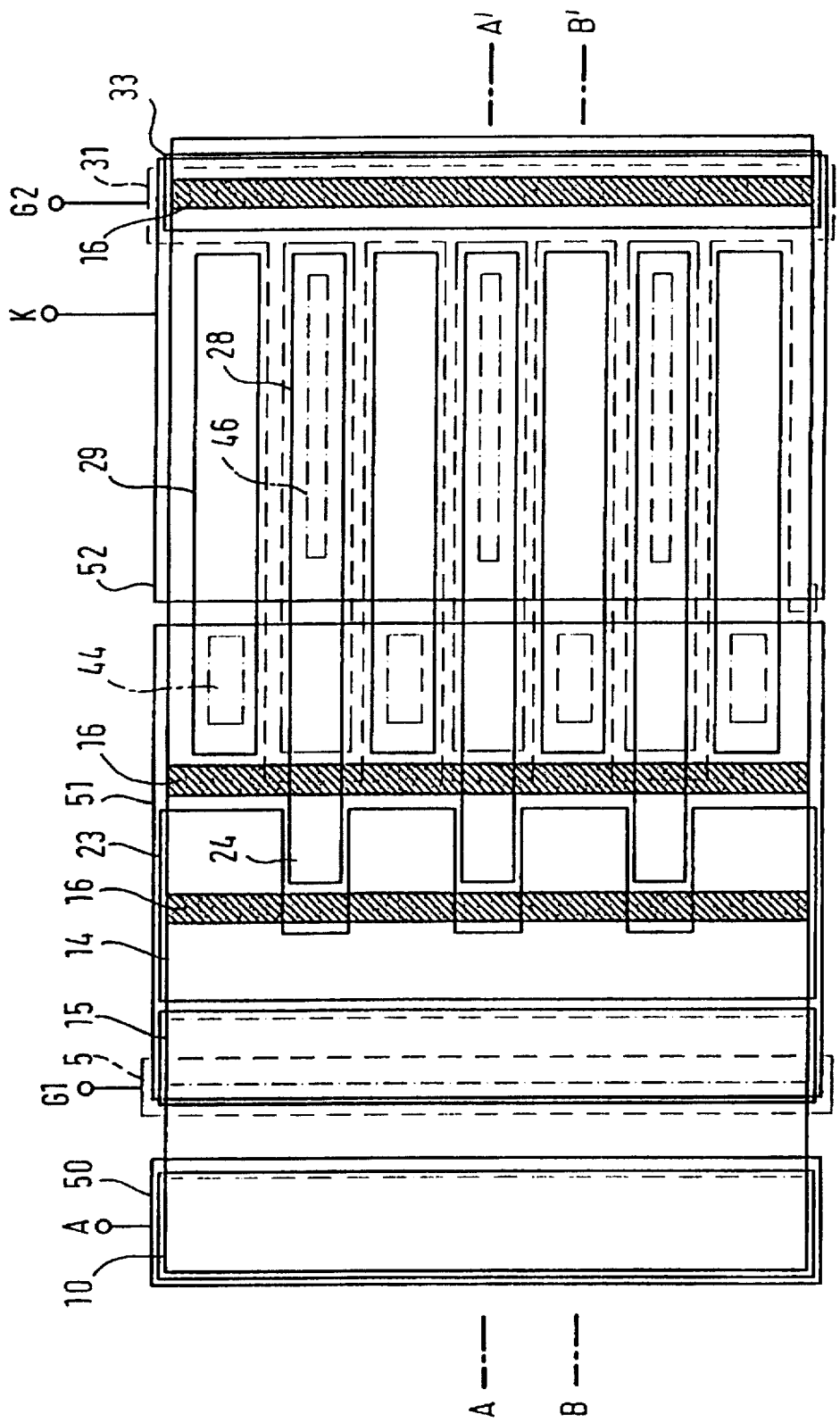
FIG. 14 is a plan view of a semiconductor device of a seventh embodiment according to the present invention.
Figure 15A:
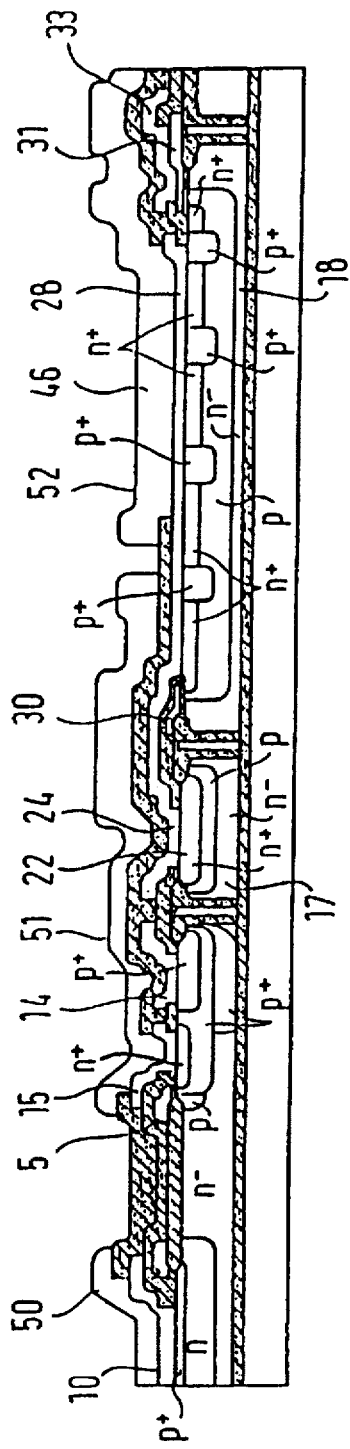
FIG. 15(a) is a cross-sectional view taken on line A–A' of FIG. 14.
Figure 15B:
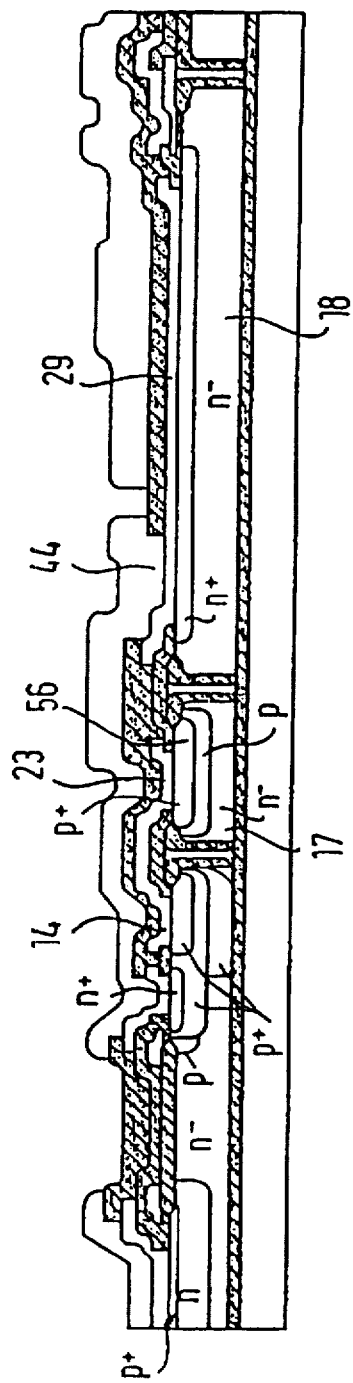
FIG. 15(b) is a cross-sectional view taken on line B–B' of FIG. 14.

Example 7 is a seventh embodiment according to the present invention and a modification of Example 6. FIG. 14 shows a plan view of an insulated gate thyristor with an insulated gate of Example 7 according to the present invention. FIG. 15(a) is a cross-sectional view taken along line A–A' of FIG. 14 and FIG. 15(b) is a cross-sectional view taken along line B–B' of FIG. 14. The device structure and the operation are substantially the same as Example 6. Therefore, the same reference numerals are used to indicate the same components as in Example 6, and duplicate explanation will be omitted.

The difference between Example 6 and Example 7 lies in pn junction diode 19, which includes plural n-type regions 22 along isolation region 16 so that n-type regions 22 and $p^+$-type contact layers 56 are alternately arranged. Accordingly, the area of pn junction diode 19 can be reduced.

EXAMPLE 8

Example 8 is an eighth embodiment according to the present invention and a modification of Example 7. FIG. 16 shows a plan view of a thyristor with an insulated gate of Example 8 according to the present invention. The device structure and the operation are substantially the same as Example 6. Therefore, the same reference numerals are used to indicate the same components as in Example 6, and duplicate explanation will be omitted. A cross-sectional view taken along line C–C' of FIG. 16 is the same as FIG. 15(a) and is a cross-sectional view taken along line D–D' of FIG. 16 is the same as FIG. 15(b).

The difference between Example 7 and Example 8 lies in pn junction diode 19. Example 8 dose not have a first isolated semiconductor region 17. The pn junction diode 19 is formed in a second isolated semiconductor region 18, and is not formed continuously. According to Example 8, the area of pn junction diode 19 can be reduced further.

EXAMPLE 9

Example 9 is a ninth embodiment according to the present invention, and shows a plurality of placements of a drain electrode 29 and a source electrode 28 of a MOS transistor 20 providing a zigzag-shaped gate electrode 30.

Figure 17:
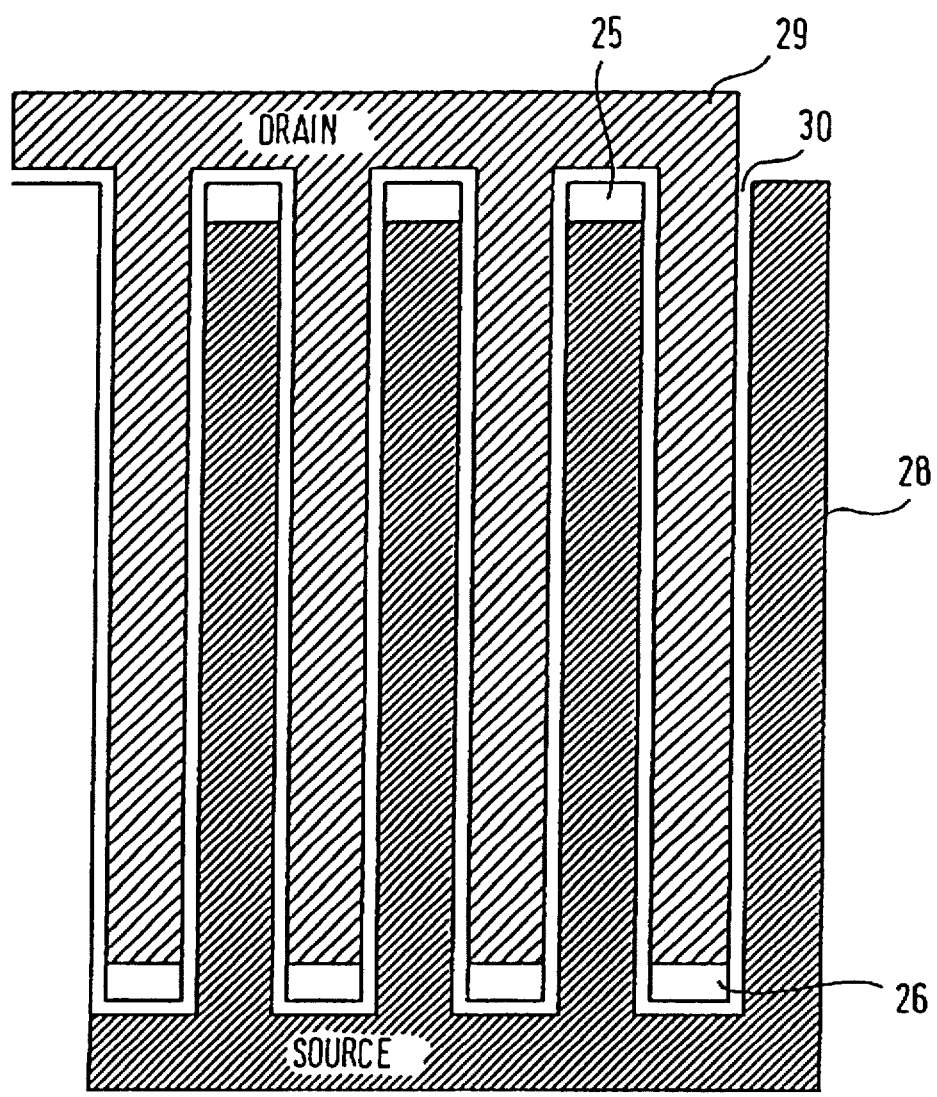
FIGS. 17 to 19 and 21(a) are plan views of a semiconductor devices of a ninth embodiment according to the present invention.

FIG. 17 is a conceptual plan view of a MOS transistor 20 using one wiring layer. Source electrode 28 and drain electrode 29 are comb-shaped and meet each other so that second gate electrode 30 is between source electrode 28 and drain electrode 29 in a zigzag. Therefore, the width of second gate electrode 30 is larger than that in Example 2.

Figure 18:
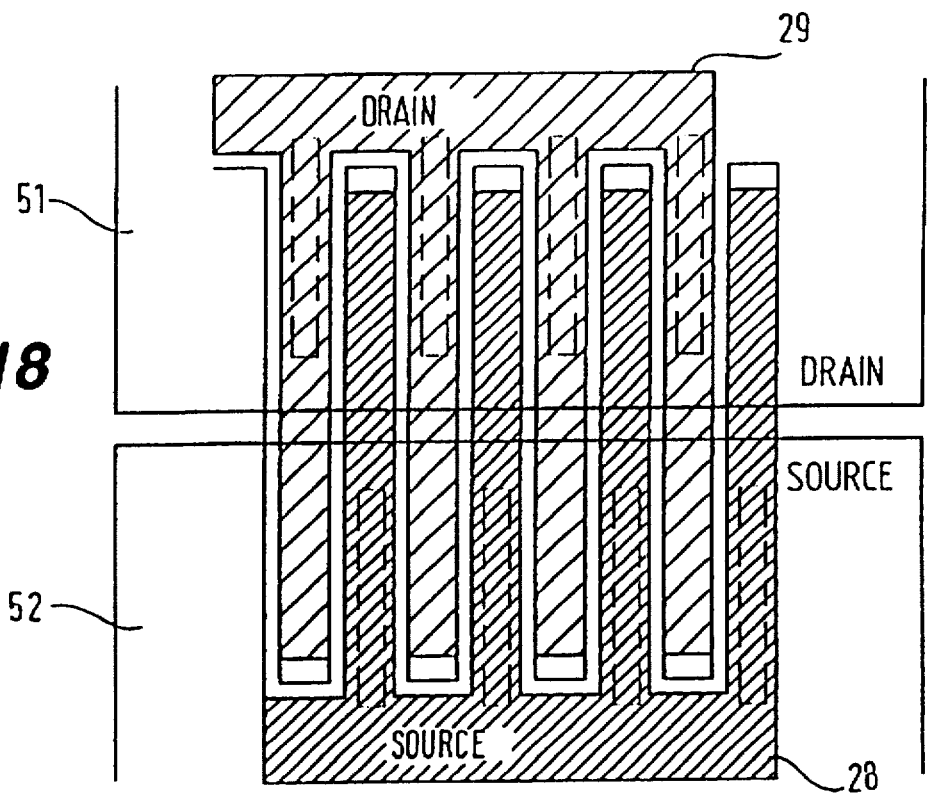

FIG. 18 is a conceptual plan view of an MOS transistor 20 using two wiring layers. The lower wiring layer is the same as FIG. 14, but the upper wiring layer includes a source electrode layer 52 and a drain electrode layer 51. Drain electrode layer 51 (preferably having a rectangular shape) is formed over drain electrode 29 via an insulator layer, and connects drain electrode 29 through contact holes (circled by a broken line) formed in the insulator layer. Source electrode layer 52 is also formed over source electrode 28 via an insulator layer, and connects source electrode 28 through contact holes (circled by a broken line) also formed in the insulator layer. The structure shown in FIG. 18 has reduced source and drain resistance because of increased area of the source and drain electrodes.

Figure 19:
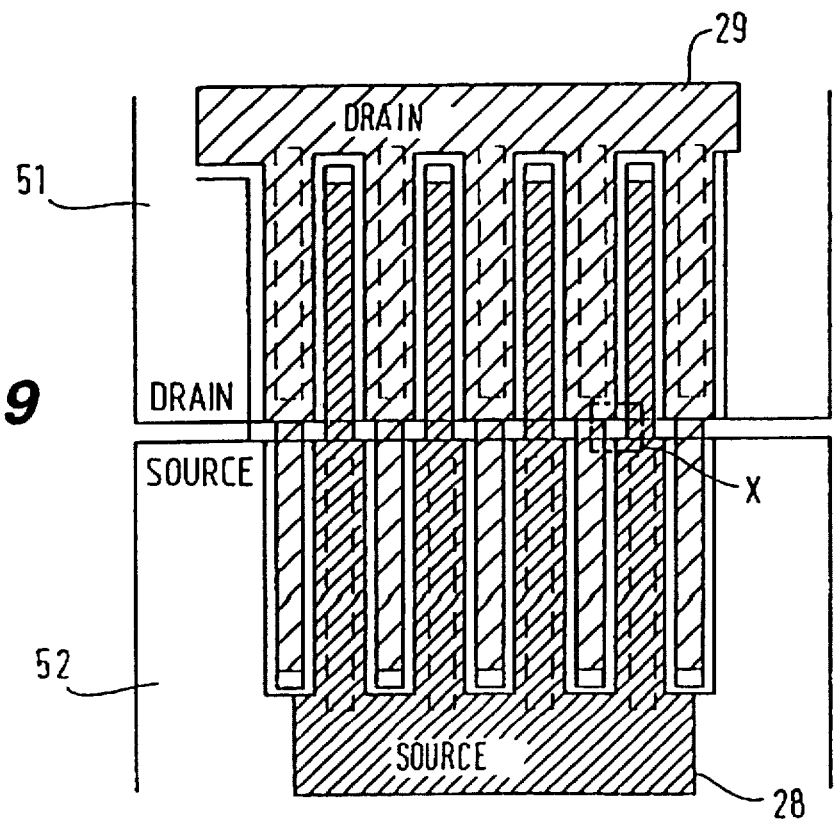

FIG. 19 is a conceptual plan view of a MOS transistor 20 using two wiring layers. Source electrode 28 is comb-shaped and each "tooth" of source electrode 28 is relatively wide under source electrode layer 52 and relatively narrow under drain electrode layer 51. Drain electrode 29 is also comb-shaped and each tooth of drain electrode 29 is relatively wide under drain electrode layer 51 and relatively narrow under source electrode layer 52. According to this structure, the pitch of comb-shaped electrodes can be smaller than the structure in FIG. 18. Thus, there is sufficient area to contact the upper and lower wiring layers even with a small pitch. Therefore, second gate electrode 30 can be made wider, resulting in lower channel resistance than the device shown in FIG. 18.

FIG. 20(a) shows enlarged area X of FIG. 19, and FIG. 20(b) shows a modification from FIG. 20(a). The structure in FIG. 20(b) is different from the structure in FIG. 20(a) in the joint portion where source electrode 28 (or drain electrode 29) changes from wide into narrow. The structure in FIG. 20(b) provides a joint portion which is narrowed at an angle. Therefore, the probability of disconnection at the joint portion in FIG. 20(b) would be less than in FIG. 20(a). Alternatively, the joint portion may be curved.

Figure 21A:
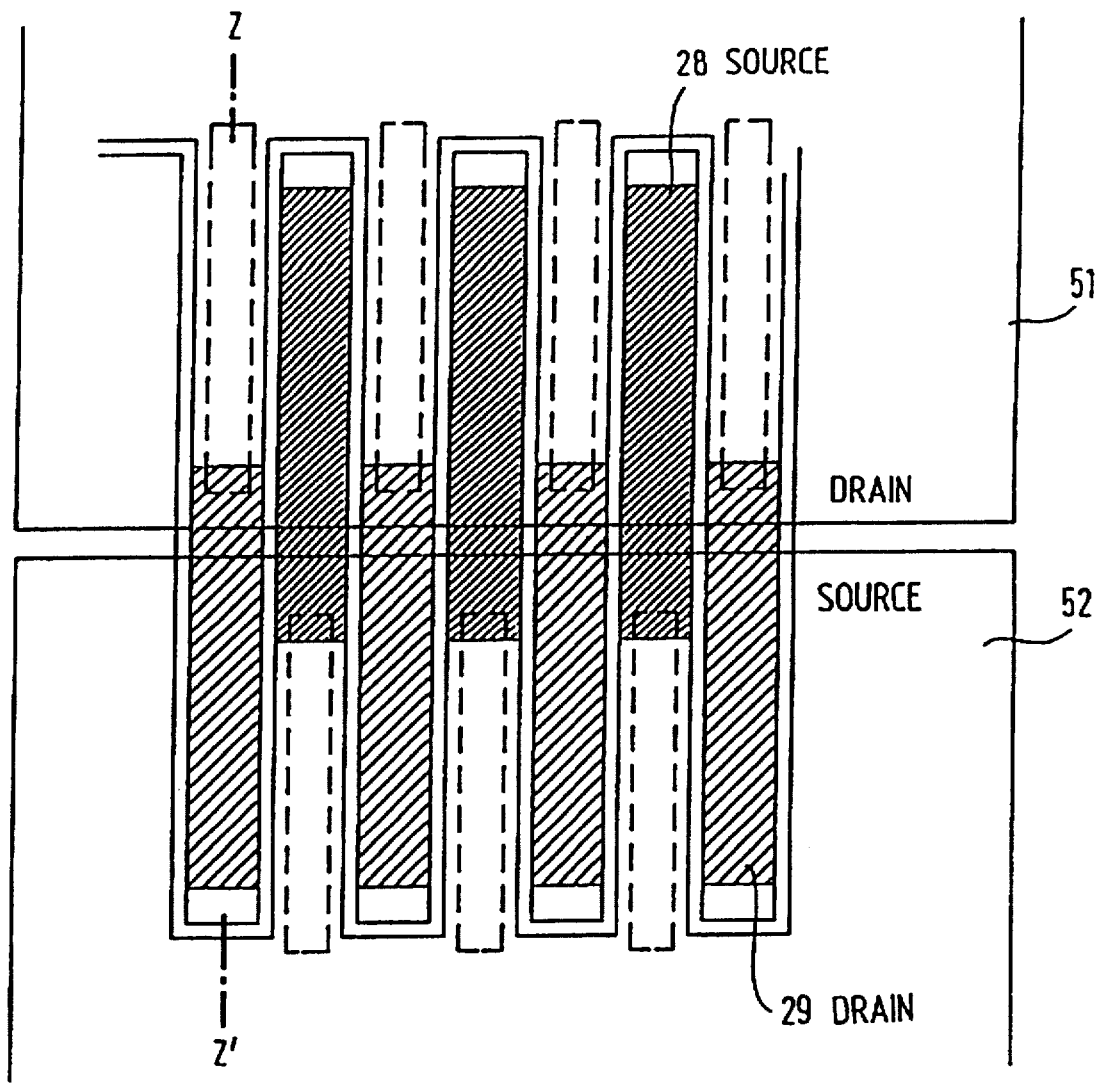
Figure 21B:
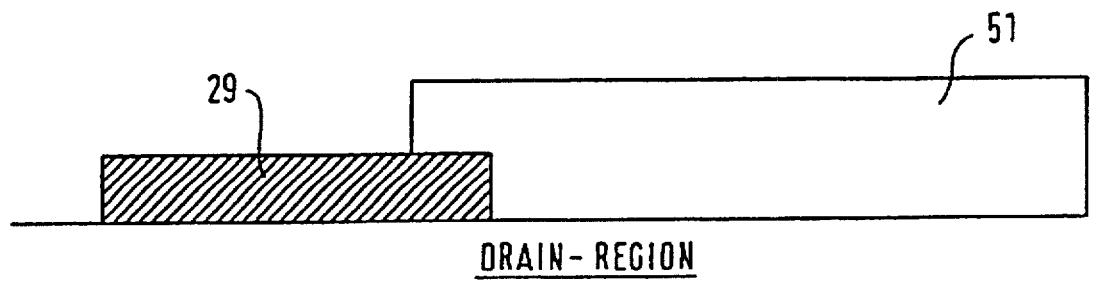
FIG. 21(b) is a cross sectional view taken on line Z–Z' in FIG. 21(a)

FIG. 21(a) is a simplified plan view of a MOS transistor 20 using two wiring layers. FIG. 21(b) shows a simplified cross-sectional view taken along line Z–Z' of FIG. 21(a). Drain electrode 29 includes plural island portions. Each island portion of drain electrode 29 connects drain electrode layer 51 at the edge portion of each island portions. Drain electrode 51 connects drain electrode 29 at contact holes and also directly connects a drain region at contact holes. According to this structure, the pitch of the source and drain electrodes can be smaller than the structure in FIG. 18.

EXAMPLE 10

Figure 22:
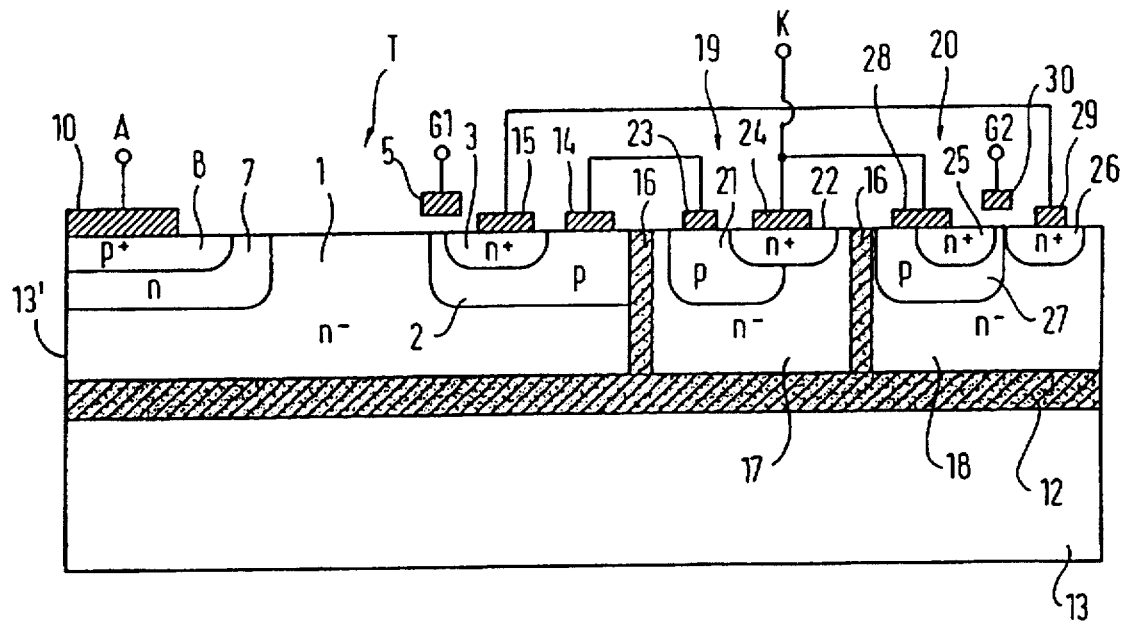
FIG. 22 is a cross-sectional view of a semiconductor device of a tenth embodiment according to the present invention.

FIG. 22 shows a conceptual sectional view of a thyristor of a tenth embodiment according to the present invention. Example 10 is a modification of Example 1 and the device structure and the operation are substantially the same as Example 1. Therefore, the same reference numerals are used to indicate the same components as in FIG. 1 and duplicate explanation will be omitted.

The thyristor portion T of Example 10 is the same as in Example 1. Also, pn junction diode 19 is the same as in Example 1. N-type drain region 26 of MOS transistor 20, however, is outside of p-type well 27. This structure can be obtained by the following exemplary processing steps: the region where n-type drain region will be formed is covered with a mask; then p-type well 27 is formed by ion implantation of $B^+$.

In Example 10, MOS transistor 20 can be provided in a low impurity concentration p-type well 27. Therefore, the pn junction between p-type well 27 and second isolated semiconductor region 18 has low impurity concentration. As a result, MOS transistor 20 can have a high break down voltage.

EXAMPLE 11

Figure 23:
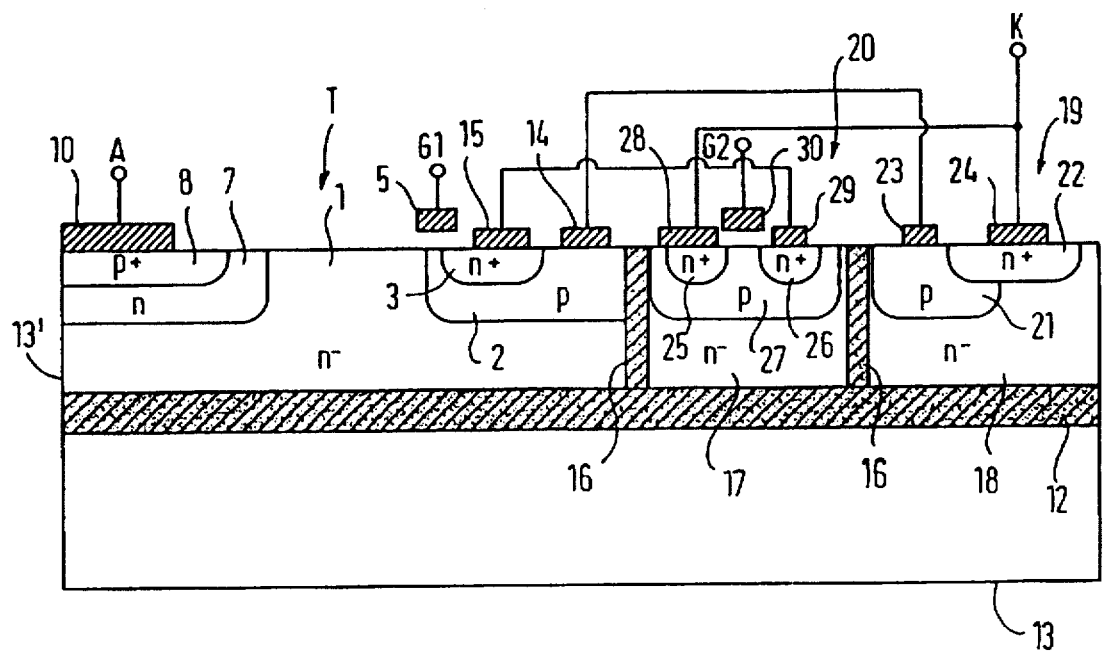
FIG. 23 is a cross-sectional view of a semiconductor device of an eleventh embodiment according to the present invention.

FIG. 23 shows a sectional view of a thyristor of an eleventh embodiment according to the present invention. This embodiment is also a modification of Example 1. The device structure of this embodiment is the same as Example 1 except that the placement of MOS transistor 20 and pn junction diode 19 is reversed.

Since the area of pn junction diode 19 may be small, the whole area of the device can easily be reduced.

EXAMPLE 12

Figure 24:
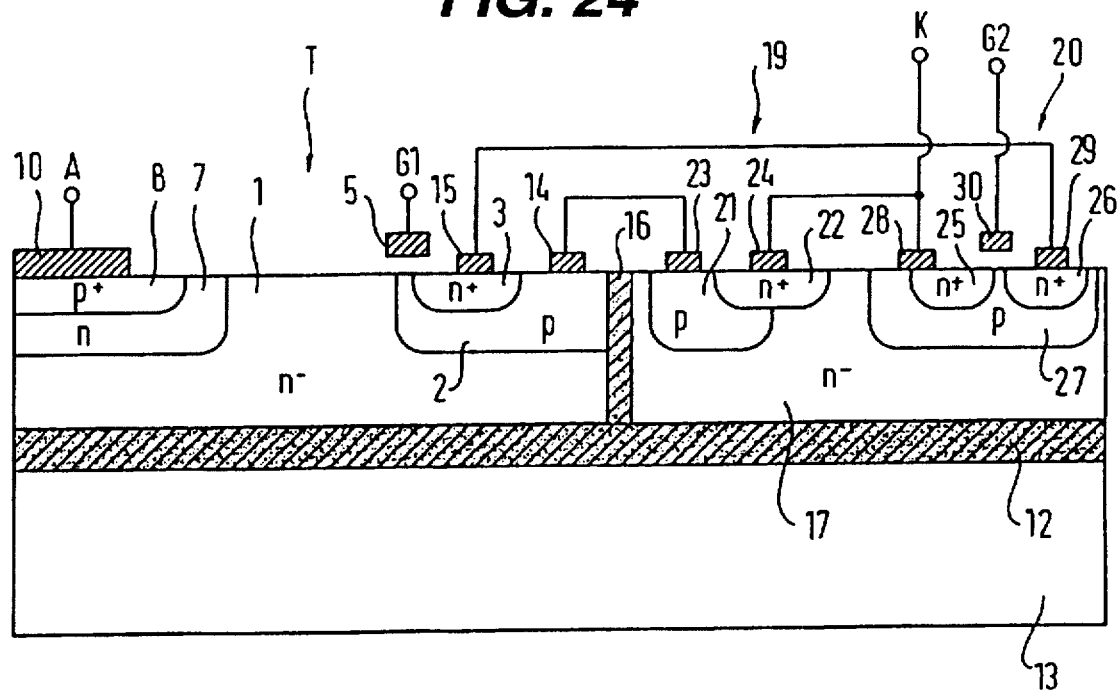
FIG. 24 is a cross-sectional view of a semiconductor device of a twelfth embodiment according to the present invention.

FIG. 24 shows a sectional view of a thyristor of a twelfth embodiment according to the present invention. This embodiment is also a modification of Example 1. The device structure is the same as Example 1 except that MOS transistor 20 and pn junction diode 19 are not isolated by isolation region 16. Therefore, the size of the device can be reduced.

EXAMPLE 13

Figure 25:
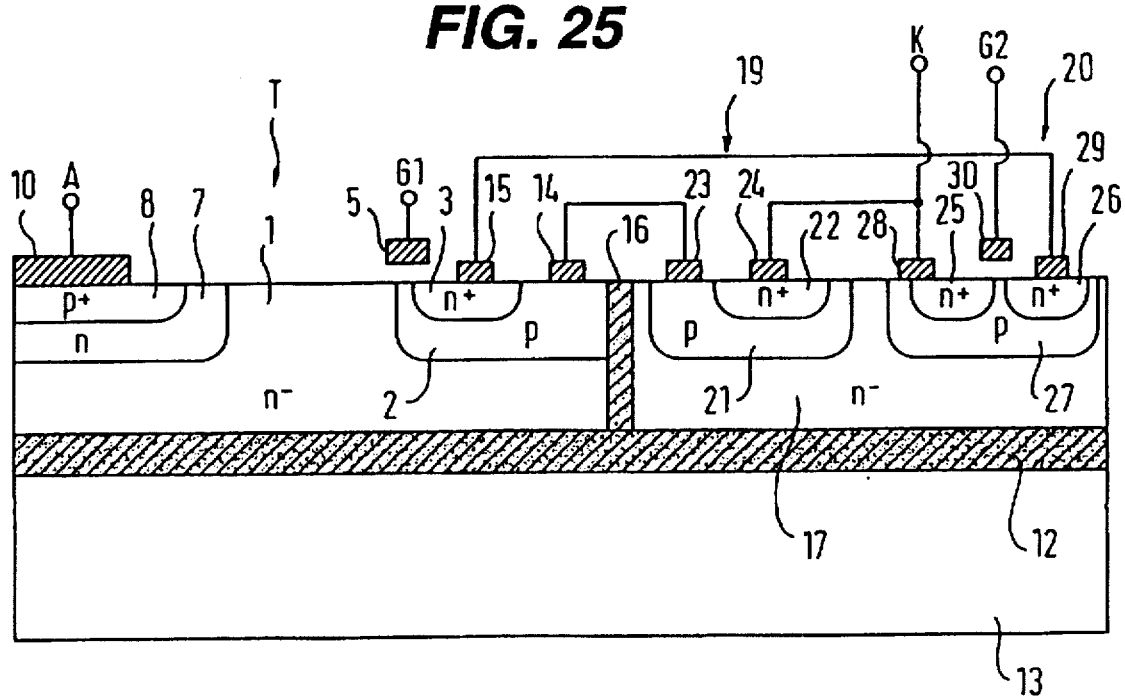
FIG. 25 is a cross-sectional view of a semiconductor device of a thirteenth embodiment according to the present invention.

FIG. 25 shows a conceptual sectional view of a thyristor of a thirteenth embodiment according to the present invention. This embodiment is also a modification of Example 1. The device structure is the same as Example 12 except that n-type region 22 of pn junction diode 19 is placed within p-type region 21. Therefore, turn-off speed may be reduced, since carriers in pn junction diode 19 do not diffuse to first isolated semiconductor region 17.

EXAMPLE 14

Figure 26:
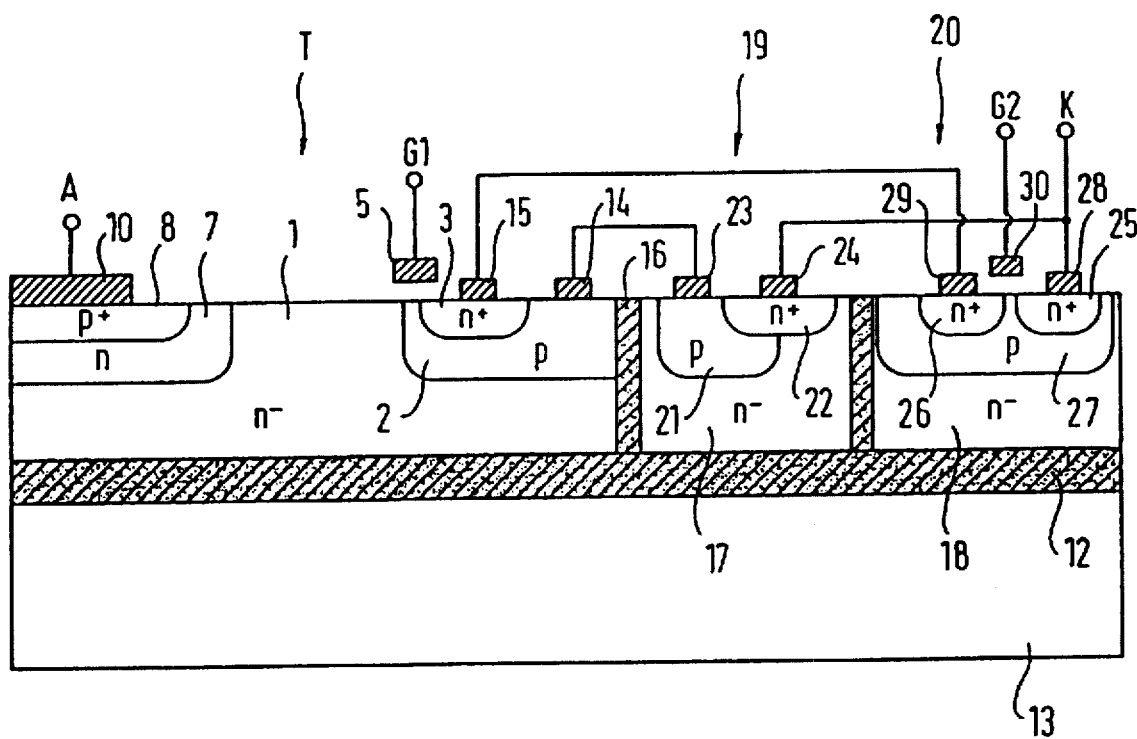
FIG. 26 is a cross-sectional view of a semiconductor device of a fourteenth embodiment according to the present invention.

FIG. 26 shows a conceptual sectional view of a thyristor of a fourteenth embodiment according to the present invention. This embodiment is also a modification of Example 1. The device structure is the same as Example 1 except that source electrode 28 does not connect to p-type well 27. This structure is advantageous when n-type source region 25 and n-type drain region 26 contact buried insulator layer 12, i.e., when the thickness of active layer 13' is relatively thin.

EXAMPLE 15

Figure 27:
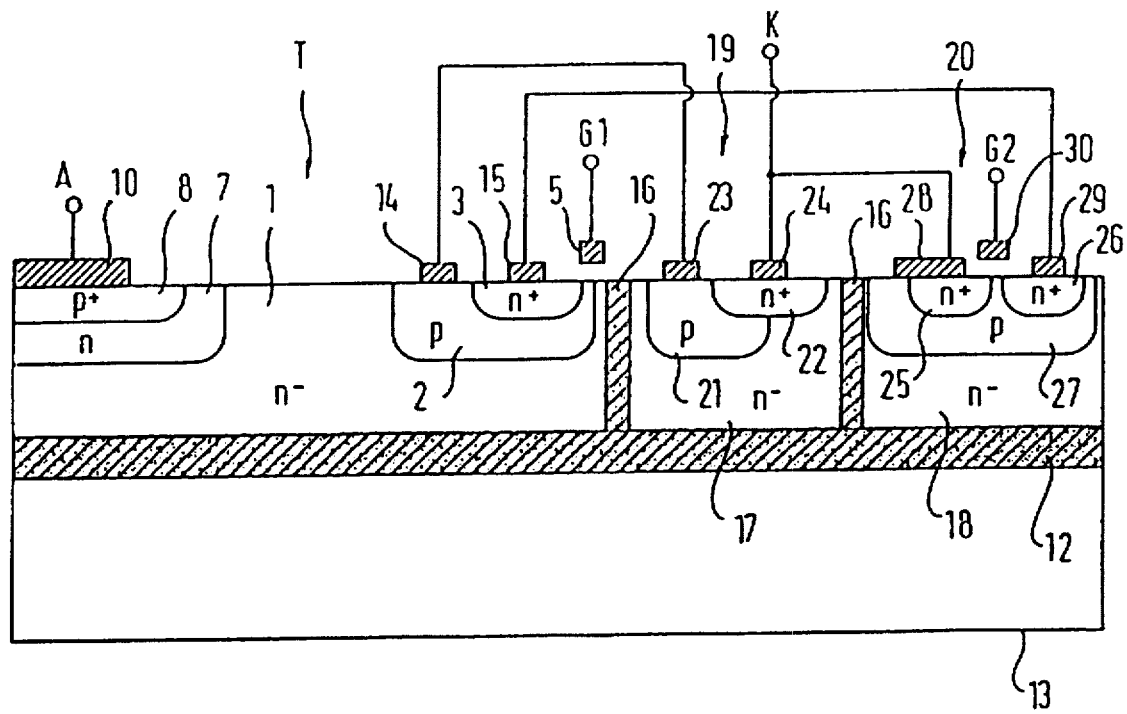
FIG. 27 is a cross-sectional view of a semiconductor device of a fifteenth embodiment according to the present invention.

FIG. 27 shows a conceptual sectional view of a thyristor according to a fifteenth embodiment according to the present invention. This embodiment is also a modification of Example 1, and provides substantially the same structure as Example 1 except for the placement of first gate electrode 5 adjacent isolation layer 16 instead of base electrode 14. Therefore, during turn-off operation, holes in n-type base layer 1 are not drained through the portion of p-type base layer 2 under n-type emitter layer 3. As a result, the forward bias of n-type emitter layer 3 can be suppressed and large current can be controlled.

EXAMPLE 16

Figure 28:
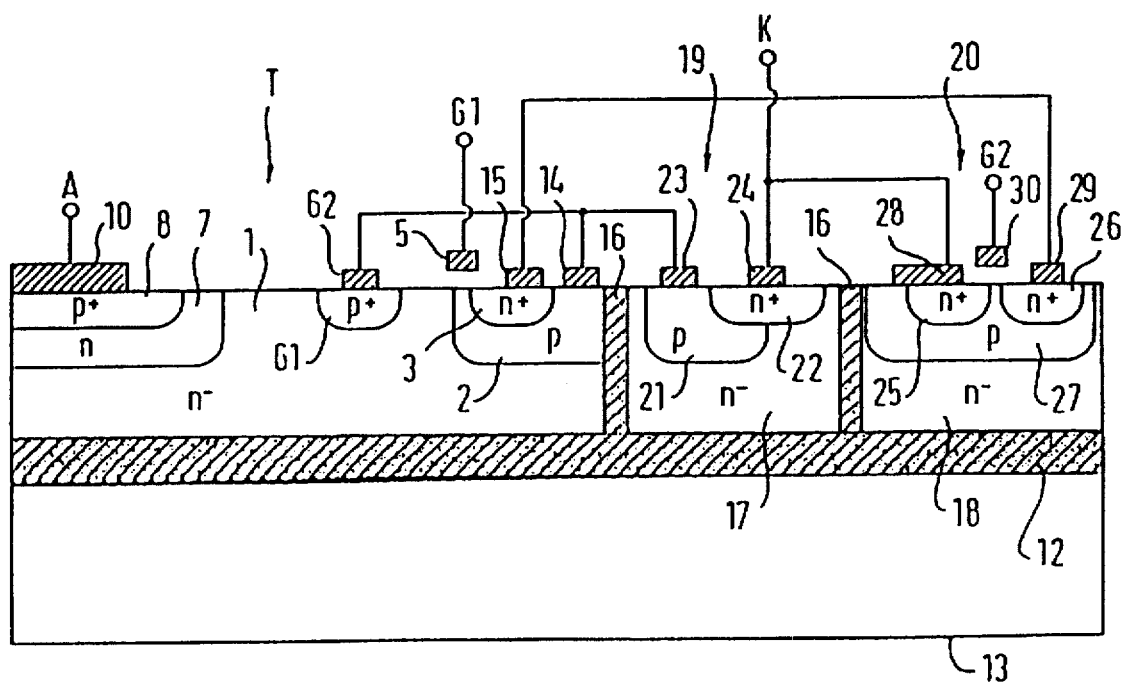
FIG. 28 is a cross-sectional view of a semiconductor device of a sixteenth embodiment according to the present invention.

FIG. 28 shows a sectional view of a thyristor according to a sixteenth embodiment according to the present invention. This embodiment is also a modification of Example 1, and provides substantially the same structure as Example 1 except that a p-type island 61 providing an electrode 62 is formed between p-type base layer 2 and p-type emitter layer 8. The electrode 62 connects to p-type base layer.

During turn-off operation, holes in n-type base layer 1 can be drained into p-type island 61. Therefore, the forward bias of n-type emitter layer 3 can be suppressed and large current can be controlled as well as in Example 15.

EXAMPLE 17

Figure 29:
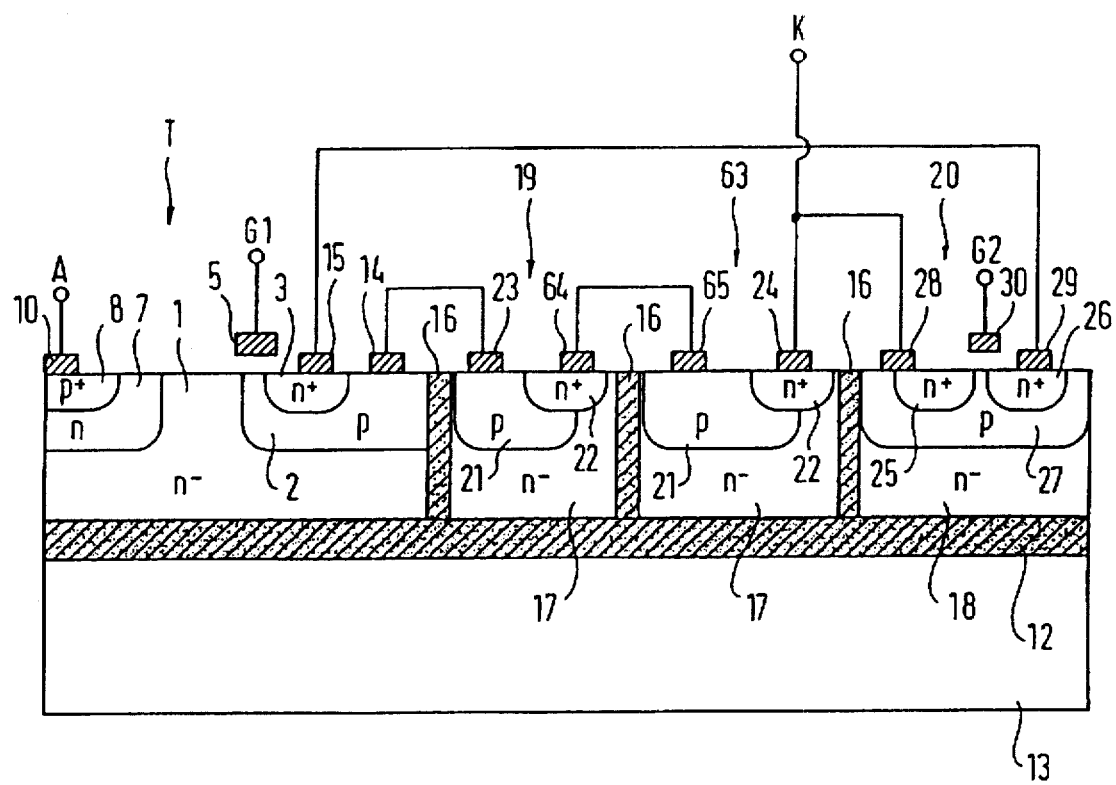
FIG. 29 is a cross-sectional view of a semiconductor device of a seventeenth embodiment according to the present invention.

FIG. 29 shows a sectional view of a thyristor according to a seventeenth embodiment according to the present invention. This embodiment is also a modification of Example 1, and provides substantially the same structure as Example 1 except that a second pn junction diode 63 is provided between pn junction diode 19 and cathode (K). An electrode 64 on n-type region of pn junction diode 19 is connected with an electrode 65 on p-type region of second pn junction diode 63.

According to Example 17, since holes are drained through two pn junction diodes 19 and 63, n-type emitter layer 3 can be easily forward biased. Therefore, turn-on operation becomes easy. Three or more diodes can also be provided.

EXAMPLE 18

Figure 30:
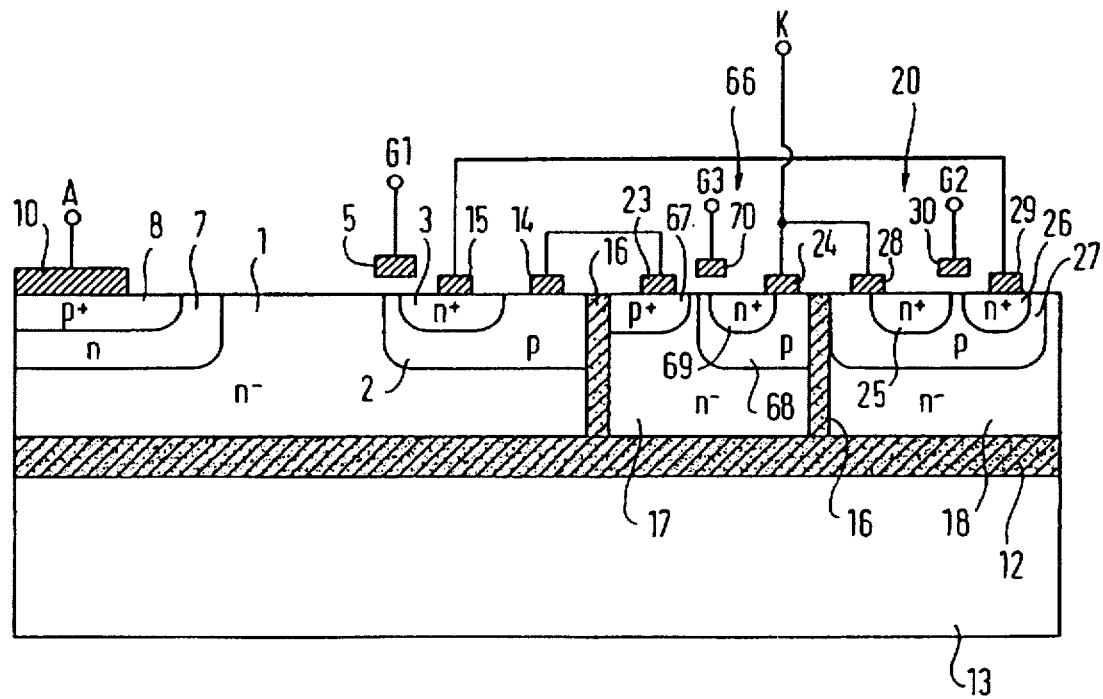
FIG. 30 is a cross-sectional view of a semiconductor device of an eighteenth embodiment according to the present invention.

FIG. 30 shows a sectional view of a thyristor of an eighteenth embodiment according to the present invention. This embodiment is also a modification of Example 1, and provides the substantially the same structure as Example 1 except that pn junction diode 19 is replaced by an IGBT 66.

IGBT 66 will now be explained. The IGBT includes a $p^+$-type region 67 providing an electrode 23, a p-type region 68, and $n^+$-type region 69 in p-type region 68 formed in first isolated semiconductor region 17. A gate electrode 70 is placed on p-type region 68 between $n^+$-type region 69 and first isolated semiconductor region 17. Cathode electrode 24 connects $n^+$-type region 69 and p-type region 68.

During turn-on operation and during the on-state, IGBT 66 is off. As a result, turn-on is quick and reliable. Therefore, electrical resistance during the on-state can be reduced and, thus, large current can be controlled. Further, during turn-off operation, the IGBT is on and, since its electrical resistance is low, the forward bias of n-type emitter layer 3 can be suppressed.

EXAMPLE 19

Figure 31:
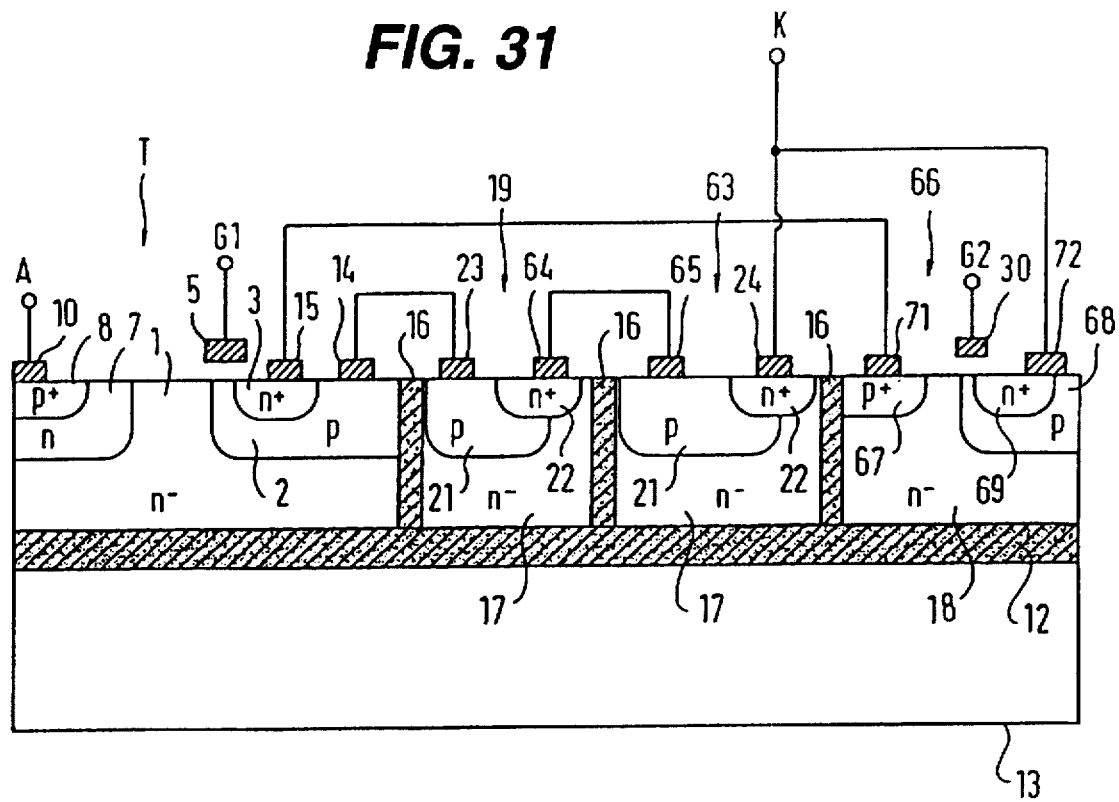
FIG. 31 is a cross-sectional view of a semiconductor device of a nineteenth embodiment according to the present invention.

FIG. 31 shows a sectional view of a thyristor of a nineteenth embodiment according to the present invention. This embodiment is a modification of Example 17. The device structure of Example 19 is the same as Example 17 except that MOS transistor 20 is replaced by an IGBT 66.

IGBT 66 including a p$^+$-type region 67 having an electrode 71, a p-type region 68, and n$^+$-type region 69 in p-type region 68 are formed in second isolated semiconductor region 18. A gate electrode 30 (second gate electrode) is placed on p-type region 68 between n$^+$-type region 69 and the second isolated semiconductor region 18. An electrode 71 connects n$^+$-type region 69 and p-type region 68 and, further, connects cathode electrode (K).

According to Example 19, since the electrical resistance of an IGBT is generally smaller than the resistance of an MOS transistor, the electric resistance of the thyristor can be reduced.

EXAMPLE 20

Figure 32:
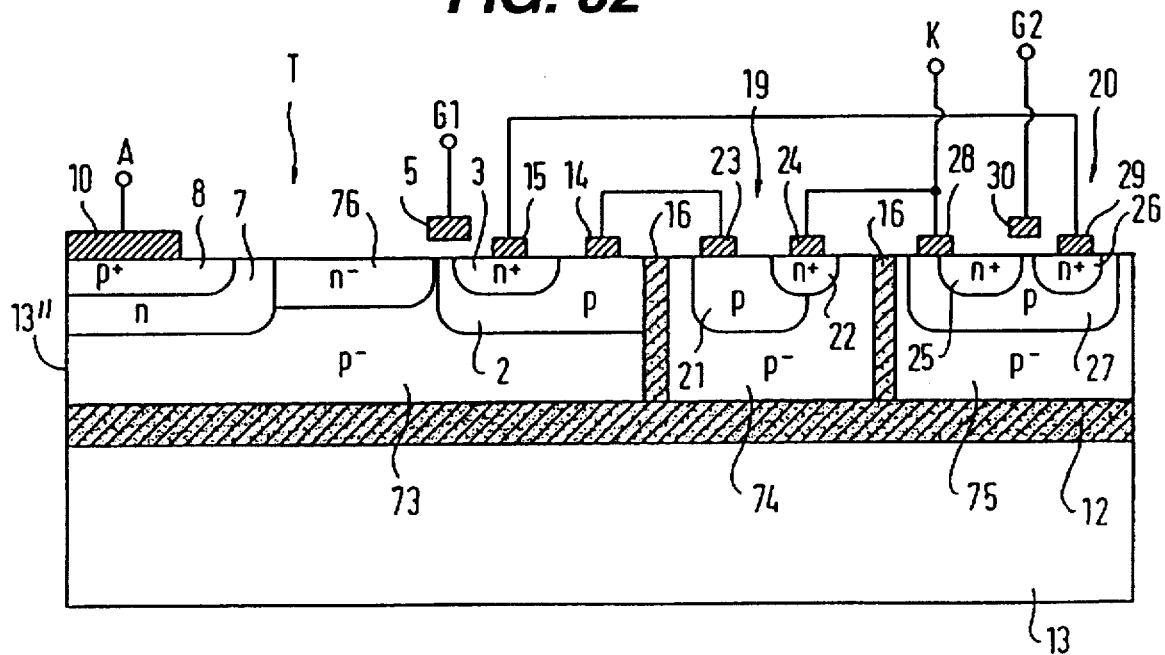
FIG. 32 is a cross-sectional view of a semiconductor device of a twentieth embodiment according to the present invention.

FIG. 32 shows a sectional view of a thyristor of a twentieth embodiment according to the present invention. This embodiment is a modification of Example 1, and provides substantially the same structure and the operation as Example 1. Therefore, the same reference numerals are used to indicate the same components as in FIG. 1 and duplicate explanation will be omitted.

The device of Example 20 uses a p$^+$-type layer 13". The p$^-$-type layer 13" is isolated, by isolation regions 16, into three p$^-$-type regions 73, 74, and 75. A pn junction diode 19 having the same structure in Example 1 is formed in p$^-$-type region 74. Also a MOS transistor 20 having the same structure in Example 1 is formed in p$^-$-type region 75. Concerning the thyristor portion T, an n$^-$-type layer 76 is formed between n-type buffer layer 7 and p-type base layer 2, for example, by implantation and diffusion of P ions.

EXAMPLE 21

Figure 33:
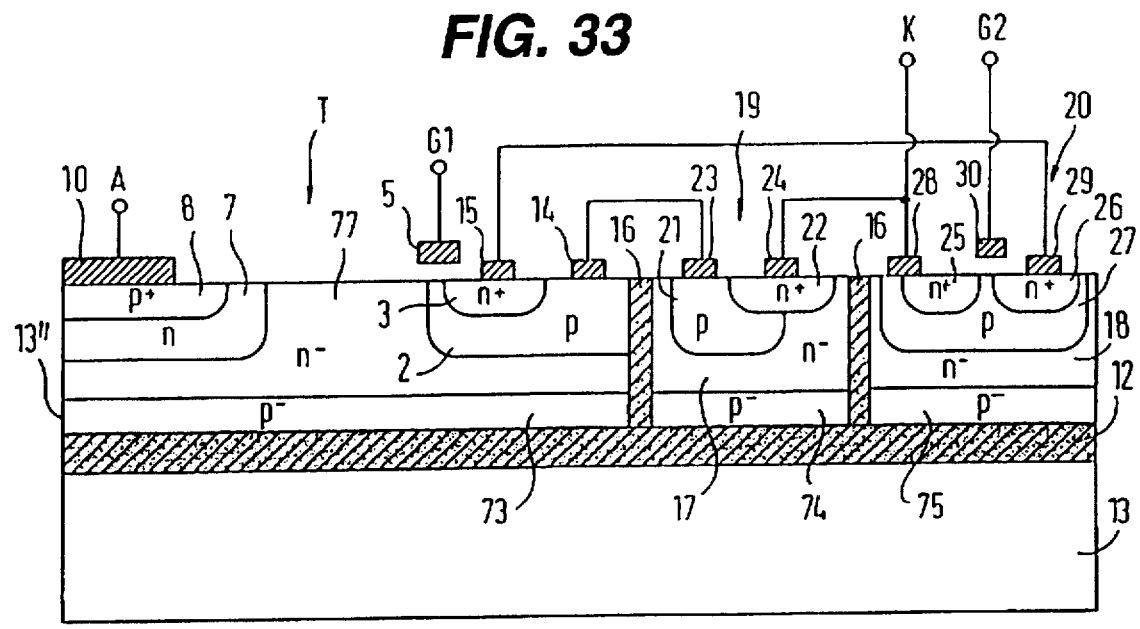
FIG. 33 is a cross-sectional view of a semiconductor device of a twenty-first embodiment according to the present invention.

FIG. 33 shows a conceptual sectional view of a thyristor of a twenty-first embodiment according to the present invention. This embodiment is a modification of Example 20.

The device of Example 21 also uses a p$^-$-type layer. In Example 21, an n$^-$-type layer 77 is formed overall. That is, the device of Example 21 is the same as the device of Example 1 but further includes p$^-$-type layer 13" between active layer 13 of n$^-$-type and buried insulator layer 12.

According to Example 21, the number of the steps for producing the device can be reduced as compared with Example 20.

EXAMPLE 22

Figure 34:
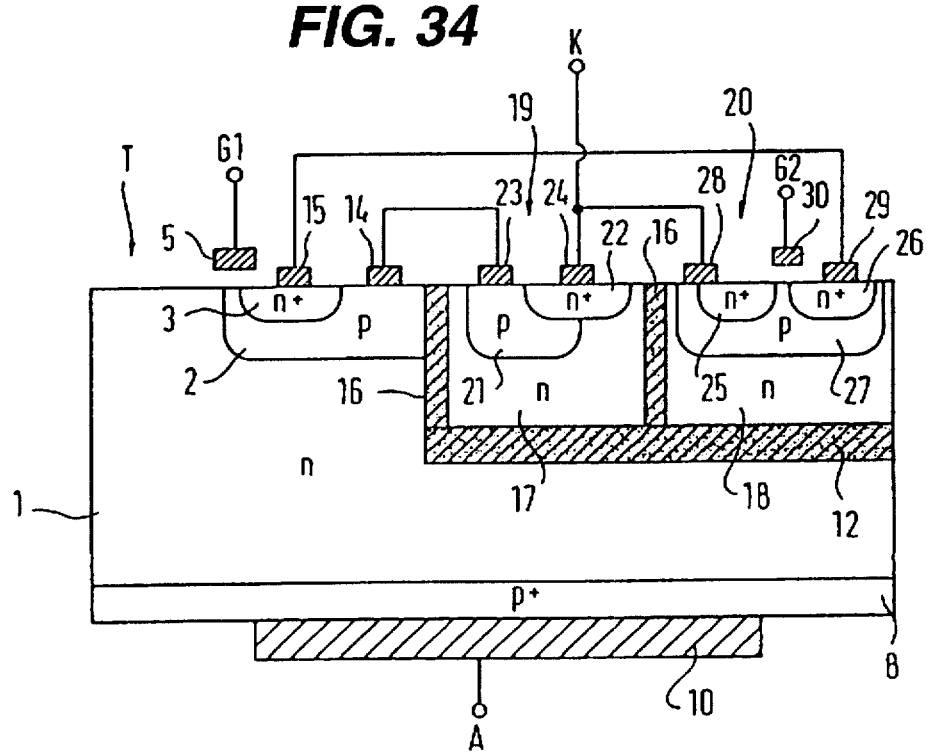
FIG. 34 is a cross-sectional view of a semiconductor device of a twenty-second embodiment according to the present invention.

FIG. 34 shows a conceptual sectional view of a thyristor of a twenty-second embodiment according to the present invention. This embodiment is a modification of Example 1, i.e., a vertical type device. The device structure and the operation are substantially the same as Example 1 except that anode electrode (A) is formed on the other surface of cathode electrode (K).

EXAMPLE 23

Figure 35:
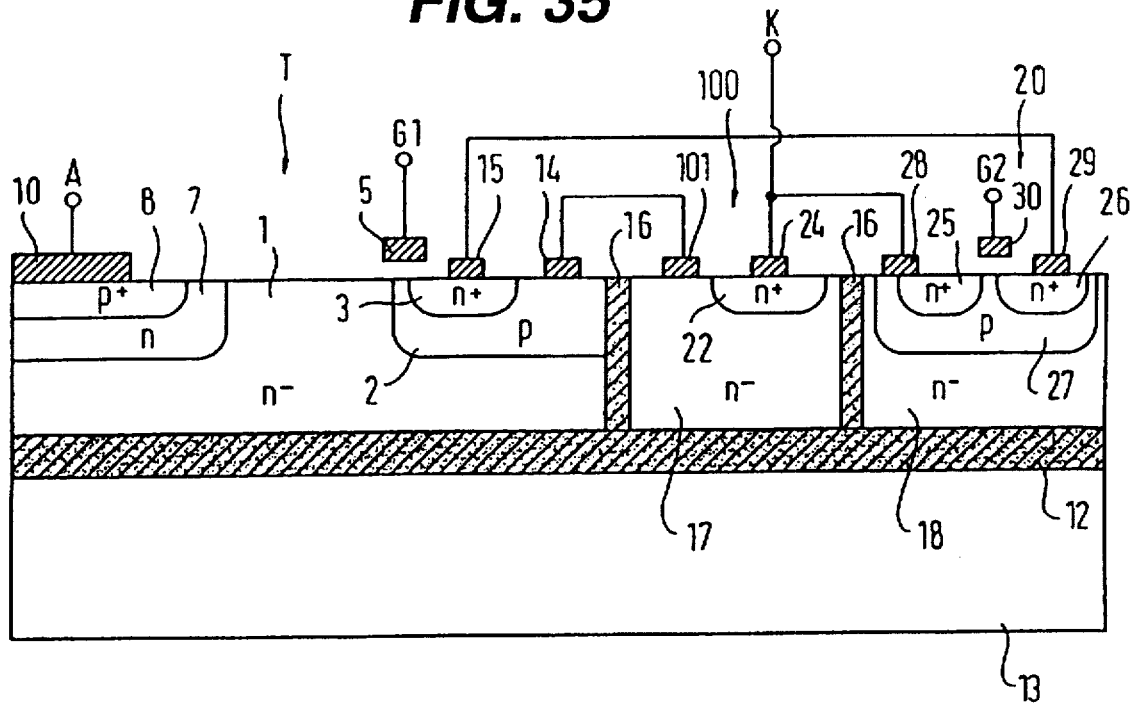
FIG. 35 is a cross-sectional view of a semiconductor device of a twenty-third embodiment according to the present invention.

FIG. 35 illustrates a twenty-third embodiment of the present invention in which pn junction diode 19 of Example 1 is replaced by a Schottky diode 100. FIG. 35 shows a conceptual sectional view of a thyristor of Example 23.

A Schottky electrode 101 is formed on first isolated semiconductor region 17. When Schottky electrode 101 is Au and first isolated semiconductor region 17 is Si, Schottky diode 100 has about 0.8 V Schottky barrier. The Schottky diode has an advantage over a pn-junction diode because the barrier height can be selected by choosing appropriate materials for the Schottky electrode 101. The pn-junction diode, however, is limited to a built-in voltage of about 1 V, if fabricated in silicon. Therefore, example 23 has flexibility in producing the device.

EXAMPLE 24

Figure 36:
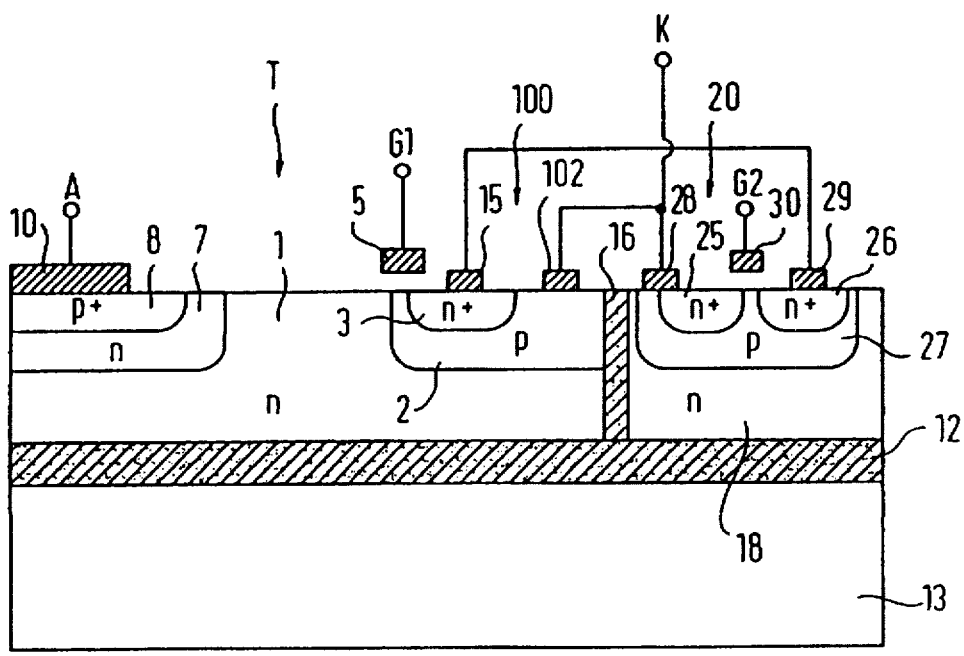
FIG. 36 is a cross-sectional view of a semiconductor device of a twenty-fourth embodiment according to the present invention.

FIG. 36 shows a sectional view of a thyristor of a twenty-fourth embodiment according to the present invention. This embodiment is a modification Example 23.

A Schottky electrode 102 is formed on p-type base layer 2 so as to constitute a Schottky diode 100. For example, Schottky electrode 102 may be made of Al, which has about 0.58 V Schottky barrier with p-type Si. Example 24 does not need the area for a separate Schottky diode 100. Therefore, the device size can be reduced.

EXAMPLE 25

Figure 37:
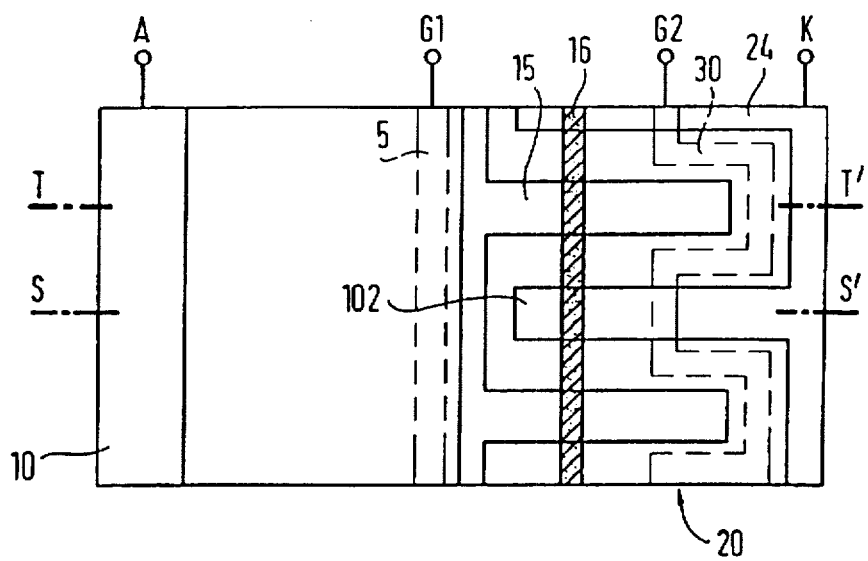
FIG. 37 is a plan view of a semiconductor device of a twenty-fifth embodiment according to the present invention.
Figure 38A:
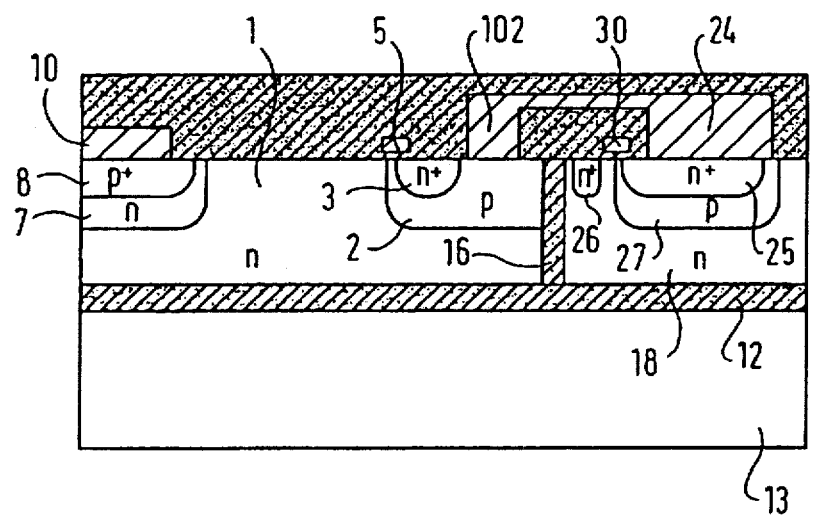
FIG. 38(a) is a cross-sectional view taken on line S–S' of FIG. 37.
Figure 38B:
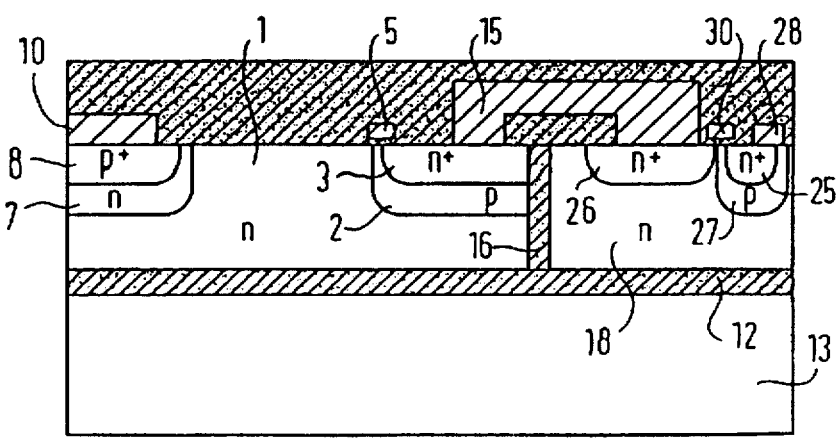
FIG. 38(b) is a cross-sectional view taken on line T–T' of FIG. 37.

FIG. 37 shows a plan view of a thyristor of a twenty-fifth embodiment according to the present invention, which is a modification from Example 24. FIG. 38(a) is a cross-sectional view taken along line S–S' of FIG. 37, and FIG. 38(b) is a cross-sectional view taken along line T–T' of FIG. 37.

Second gate electrode 30 of MOS transistor 20 has a zigzag shape as in Example 2.

EXAMPLE 26

Figure 39:
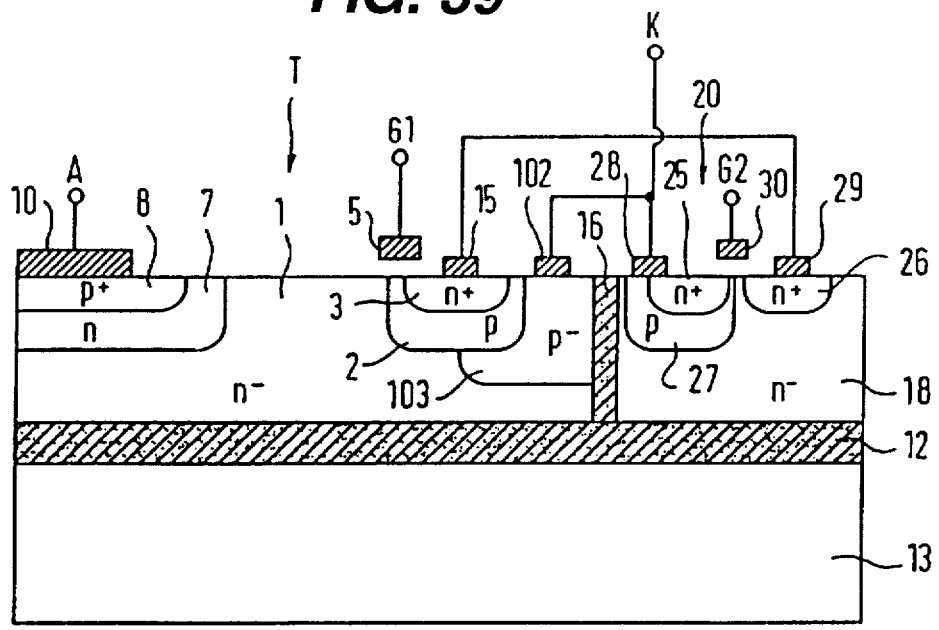
FIG. 39 is a cross-sectional view of a semiconductor device of a twenty-sixth embodiment according to the present invention.

FIG. 39 shows a conceptual cross-sectional view of a thyristor of a twenty-sixth embodiment according to the present invention, which is a modification from Example 24. The thyristor of Example 26 provides a p$^-$-type layer 103 connected with p-type base layer 2. Schottky electrode 102 is formed on p$^-$-type layer 103. According to Example 26, the dose amount of p$^-$-type layer 103 can be controlled independently of the dose of p-type base layer 2.

EXAMPLE 27

In the above-mentioned Examples 1 to 26, when the thyristor is turned off, channels under first gate electrode 5 and second gate electrode 30 are shut off by supplying a negative voltage of cathode electrode (K) to first gate terminal (G1) and second gate terminal (G2). If the channel under second gate electrode 30 is shut off before the channel under first gate electrode 5, a high voltage will be applied between source electrode 28 and drain electrode 29 and MOS transistor 20 could break down under extreme circumstances. Therefore, the channel under second gate electrode 30 is required to be either shut off later than the channel under first gate electrode 5, or at the same time.

Figure 40:
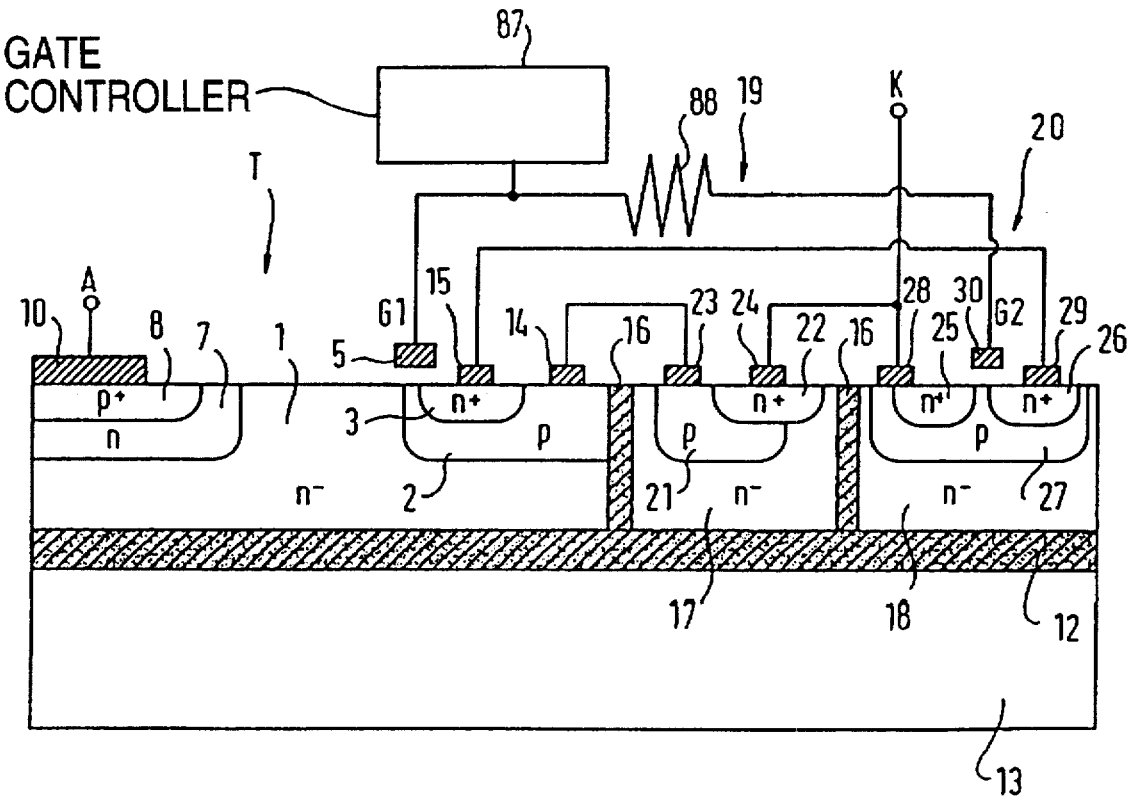
FIG. 40 is a cross-sectional view of a semiconductor device of a twenty-seventh embodiment according to the present invention.

For obtaining such an operation, a turn-off signal may be applied to second gate terminal (G2) after the first gate terminal (G1). Example 27 is a thyristor of a twenty-seventh embodiment according to the present invention, which can perform such an operation. FIG. 40 shows a cross-sectional view of the thyristor of Example 27, which is a modification from Example 23. The thyristor of Example 27 provides a gate controller 87 generating a signal to first and second gate terminals G1 and G2. Further, a resistor 88 is connected between gate controller 87 and second gate terminal G2 in series so that the signal to second gate terminal G2 is delayed. As a result, the channel under second gate electrode 30 is shut off after the channel under first gate electrode 5.

The device structures shown in the above-described drawings can be used in the device illustrated in FIG. 40. For example, the MOS transistor of FIG. 40 can be replaced by the MOS transistor of FIG. 22 or the IGBT of FIG. 31. Also, the semiconductor rectifier can be replaced by the rectifier of FIG. 35, i.e., a Schottky diode.

EXAMPLE 28

Figure 41:
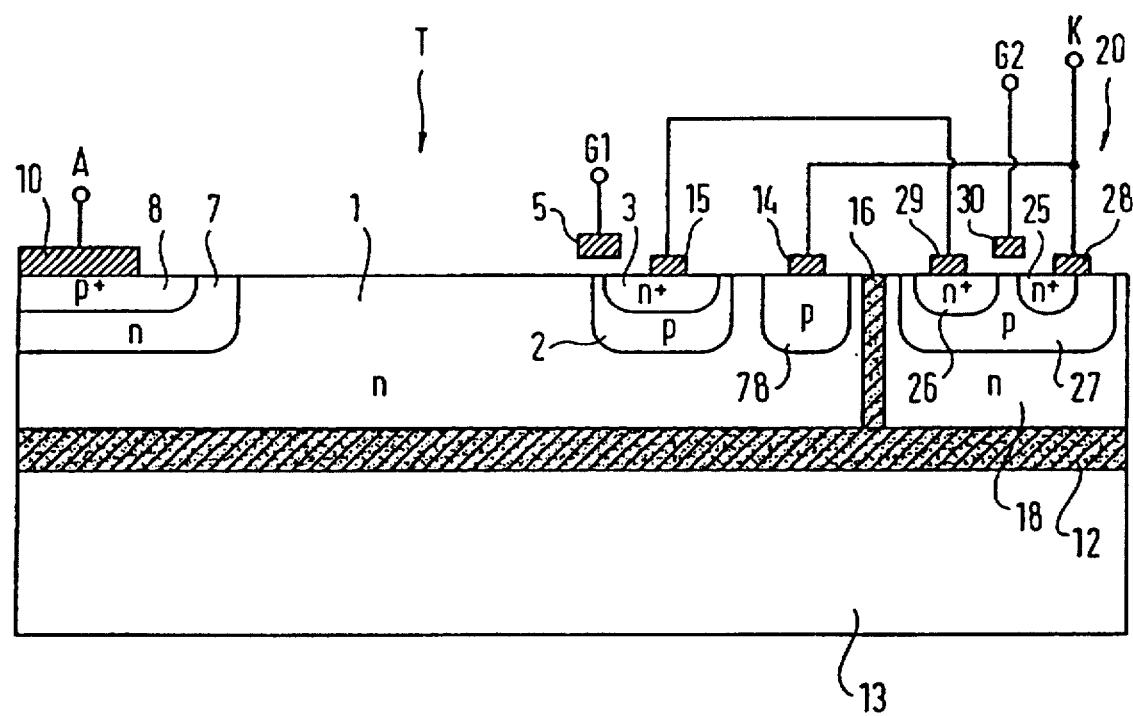
FIG. 41 is a cross-sectional view of a semiconductor device of a twenty-eighth embodiment according to the present invention.

FIG. 41 shows a cross-sectional view of a thyristor of a twenty-eighth embodiment according to the present invention, which is a modification at Example 1. In the example, pn junction diode 19 of Example 1 is replaced by a second p-type base layer 78 constituting a base electrode 14.

During turn-on operation, holes injected into n-type base layer 1 flow through p-type base layer 2 to second p-type base layer 78. At that time, resistance for hole current is sufficiently high so that the electric potential of p-type base layer 2 rises. As a result, a pn junction between n-type emitter layer 3 and p-type base layer 2 is forward biased and the device is turned on.

According to Example 28, since the area of pn junction diode 19 is not required, the size of the device can be reduced. Further, since the electric resistance for hole current is sufficiently high, the hole current required during the on-state may be reduced. As a result, a small on-voltage can be obtained.

EXAMPLE 29

Figure 42:
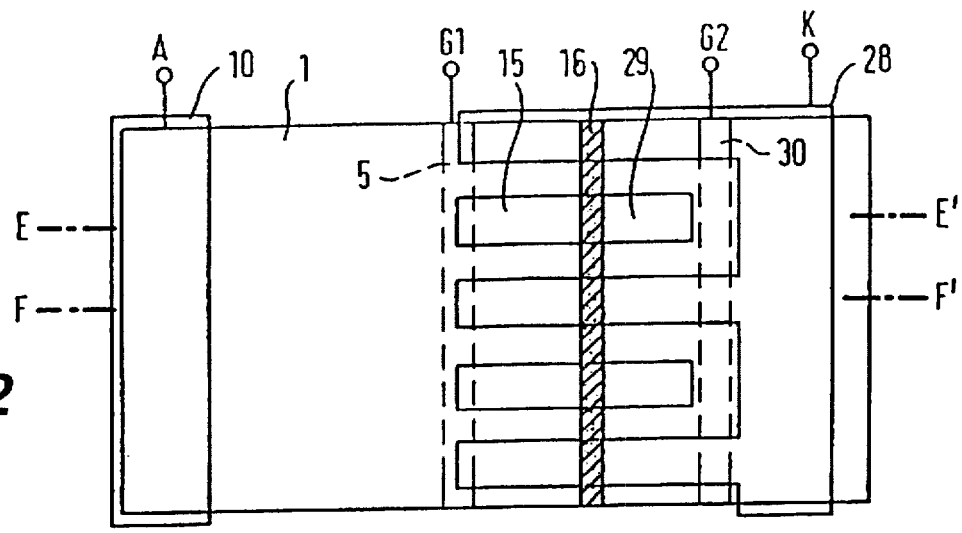
FIG. 42 is a plan view of a semiconductor device of a twenty-ninth embodiment according to the present invention.
Figure 43A:
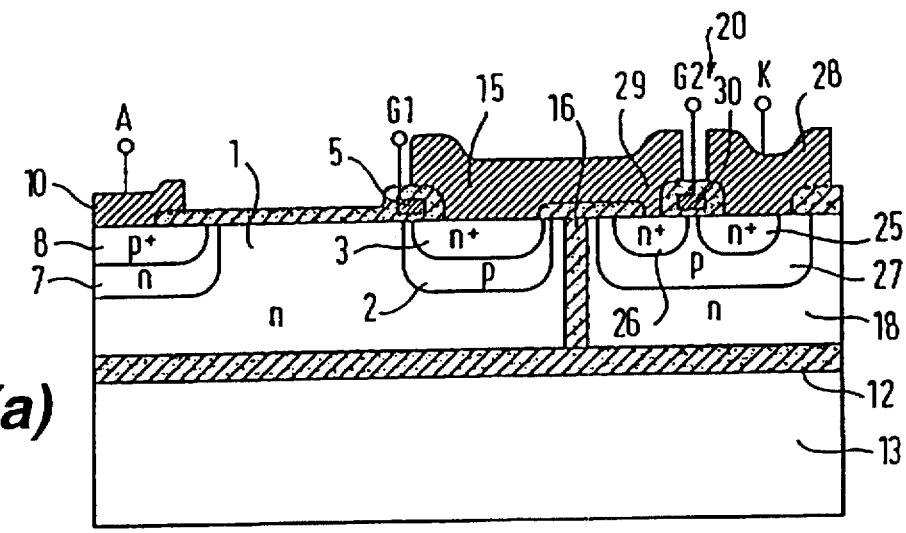
FIG. 43(a) is a cross-sectional view taken on line E–E' of FIG. 42.
Figure 43:
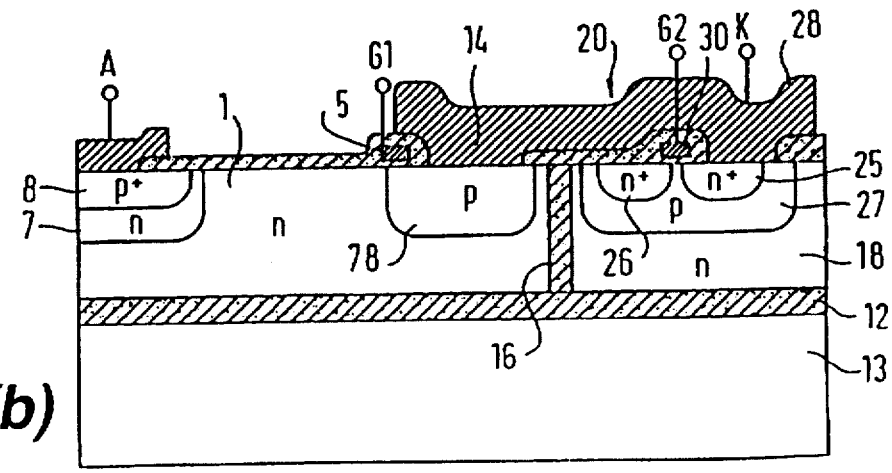
FIG. 43(b) is a cross-sectional view taken on line F–F' of FIG. 42.

FIG. 42 shows a plan view of a thyristor of a twenty-ninth embodiment according to the present invention, which is a modification of Example 28. FIG. 43(a) is a cross-sectional view taken along line E–E' of FIG. 42, and FIG. 43(b) is a cross-sectional view taken along line F–F' of FIG. 42.

The thyristor of Example 29 includes plural p-type base layers 2 and second p-type base layers 78 so that p-type base layers 2 and second p-type base layers are arranged alternately along first gate electrode 5.

According to Example 29, the size of the device can be further be reduced.

EXAMPLE 30

Figure 44:
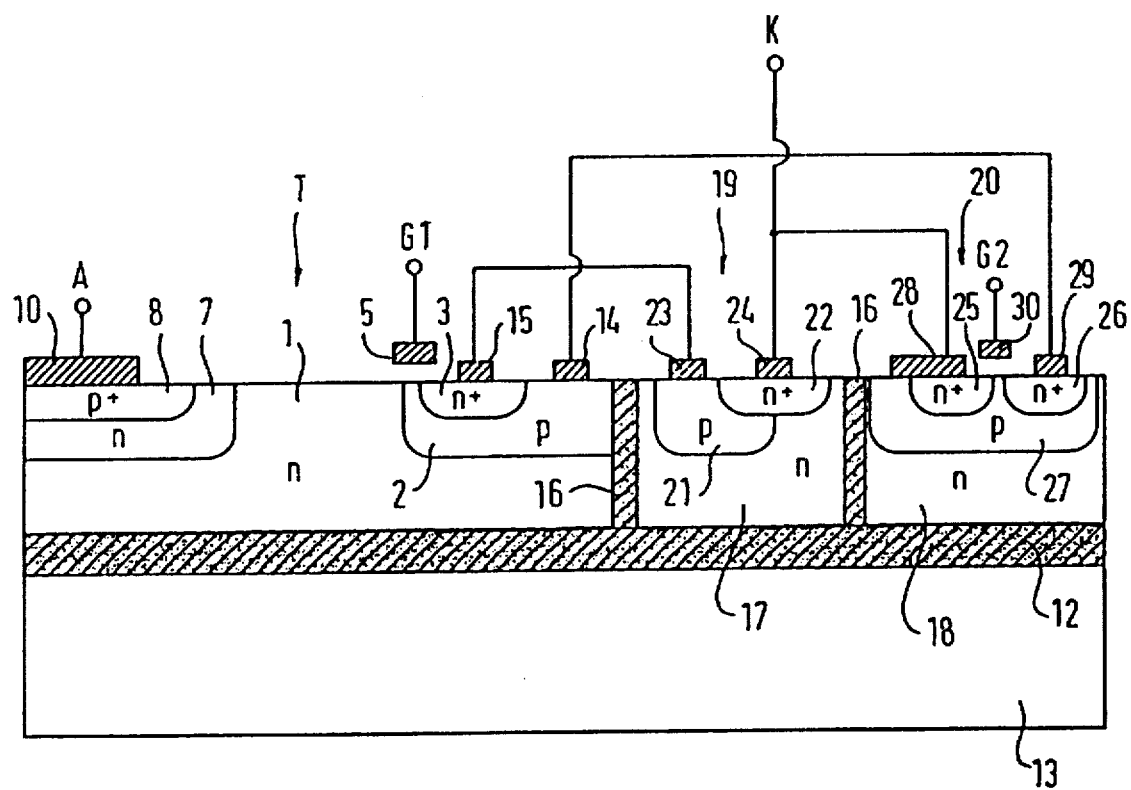
FIG. 44 is a cross-sectional view of a semiconductor device of a thirtieth embodiment according to the present invention.

FIG. 44 shows a conceptual cross-sectional view of a thyristor of a thirtieth embodiment according to the present invention, which is a modification of Example 1. The thyristor of Example 30 provides a pn junction diode 19 between emitter electrode 15 and cathode (K), not between base electrode 14 and cathode (K). Further, a MOS transistor 20 is provided between base electrode 14 and cathode (K), not between emitter electrode 15 and cathode (K).

Turn-on operation of this embodiment will now be explained.

While a positive voltage with respect to cathode (K) is applied to anode (A), a positive voltage with respect to cathode (K) is applied to first gate terminal G1. Since n-type channels appear under first gate electrode 5, pn junction diode 19 and another diode composed of p-type emitter layer 8 and n-type base layer 1 are forward biased. As a result, electrons are injected into n-type base layer 1 from n-type emitter layer 3 through the channel. At that time, holes are also injected into n-type base layer 1 from p-type emitter layer 8. The holes flow into p-type base layer 2 and cause electron injection directly from n-type emitter layer 3. Thus, turn-on operation is completed and the positive voltage applied to first gate terminal (G1) is no longer required. Since the hole current required during on-state is small, a small on-voltage can be obtained.

Turn-off operation will be now explained.

A negative voltage with respect to cathode (K) or zero voltage is applied to first gate terminal G1 so that the n-type channel under first gate electrode 5 disappears. However, a positive voltage with respect to cathode (K) is applied to second gate terminal (G2) to form an n-type channel under second gate electrode 30. As a result, p-type base layer 2 is short-circuited with cathode (K) by MOS transistor 20. Then the device is turned off.

The electric potential of p-type base layer 2 will be higher than the potential of cathode (K) during turn-off operation because the potential drop caused by hole current through MOS transistor 20. If the voltage drop causes the pn junction between n-type emitter layer 3 and p-type base layer 2 to be forward biased more than the built-in potential of the pn junction, the thyristor will be latched up and the device will be unable to turn-off.

However, since the thyristor of Example 30 provides a pn junction diode 19 between n-type emitter layer and cathode (K), a higher potential drop of p-type base layer 2 is required to latch up the thyristor. Therefore, a larger current can be shut-off with the thyristor of Example 31.

During turn-off operation, it is preferable that a positive voltage is applied to first gate terminal (G1) before applying the positive voltage to second gate terminal (G2), and then a negative voltage is applied to first gate terminal (G1). According to such an operation, a large current can be shut off.

Moreover, since the positive voltage applied to first gate terminal (G1) is not required during on-state, the positive voltage may be applied to the first gate terminal just before turn-off operation begins.

Figure 45:
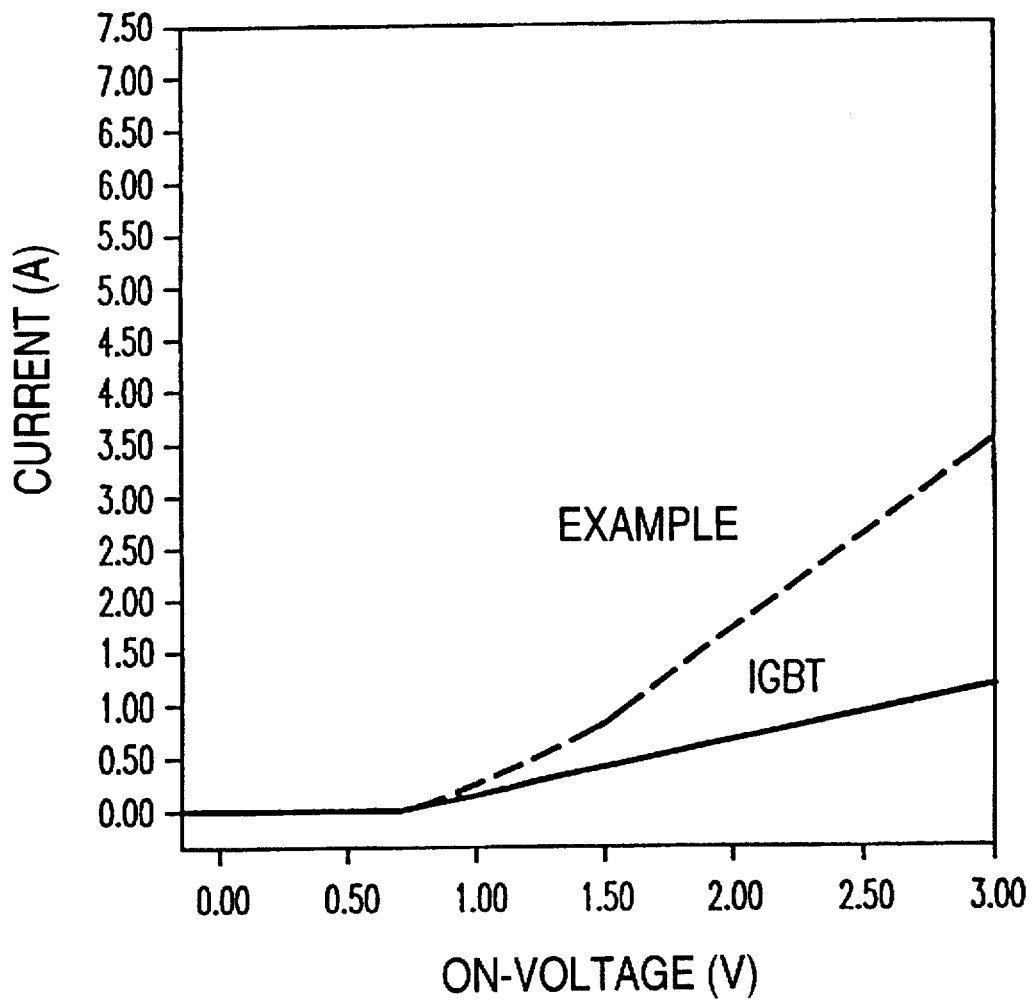
FIG. 45 is a graph showing the relation between on-voltage and current of the thirtieth embodiment.

FIG. 45 is a graph showing a voltage-current property of the thyristor of Example 30 (dashed line). A voltage-current property of a conventional IGBT is also shown as a continuous line. As seen in FIG. 45, the thyristor according to Example 30 can obtain about three times as much current as the conventional IGBT at about 3 V of on-voltage.

The device structures shown in the above-mentioned drawings can be used in the device of FIG. 44. For example, the MOS transistor of FIG. 44 can be replaced by the MOS transistor of FIG. 32 or the IGBT of FIG. 31. Also, the semiconductor rectifier can be replaced by the rectifier of FIG. 35, i.e., a Schottky diode.

EXAMPLE 31

Figure 46:
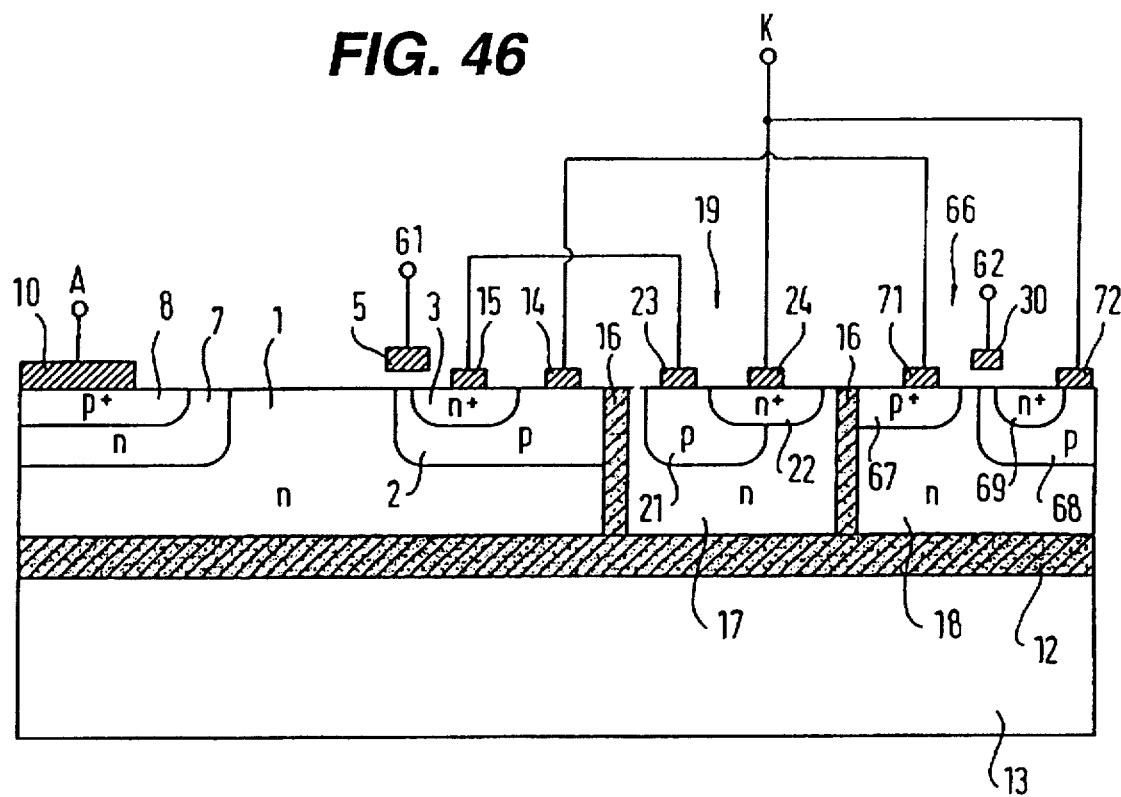
FIG. 46 is a cross-sectional view of a semiconductor device of a thirty-first embodiment according to the present invention.

FIG. 46 shows a conceptual cross-sectional view of a thyristor of a thirty-first embodiment according to the present invention, which is a modification of Example 30, wherein MOS transistor 20 of Example 30 is replaced by an IGBT 66.

As discussed above, the resistance of MOS transistor 20 may forward bias the pn junction between n-type emitter layer 3 and p-type base layer 2, preventing proper turn-off operation. However, since IGBT 66 generally can have a smaller resistance than MOS transistor 20, the thyristor of Example 29 may have a larger turn-off ability than the thyristor of Example 30.

EXAMPLE 32

Figure 47:
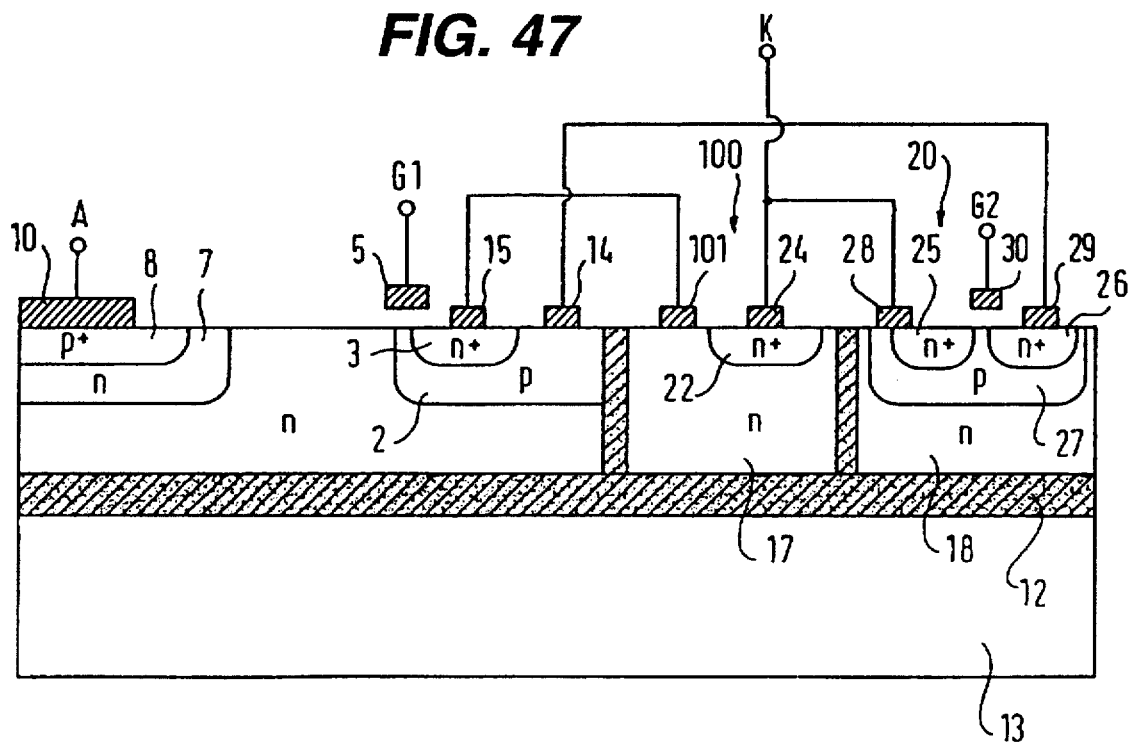
FIG. 47 is a cross-sectional view of a semiconductor device of a thirty-second embodiment according to the present invention.

FIG. 47 shows a conceptual cross-sectional view of a thyristor of a thirty-second embodiment according to the present invention, which is also a modification from Example 30. In this example, the pn junction diode 19 of Example 30 is replaced by a Schottky diode 100.

EXAMPLE 33

Figure 48:
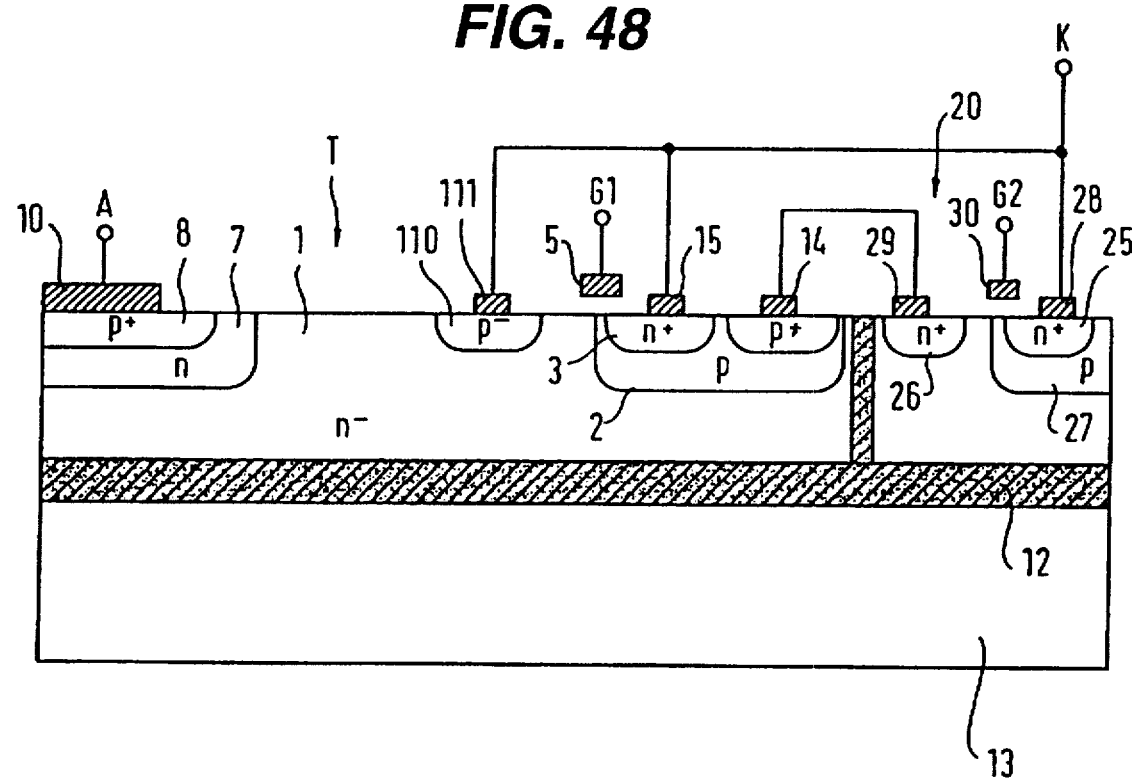
FIG. 48 is a cross-sectional view of a semiconductor device of a thirty-third embodiment according to the present invention.
Figure 49:
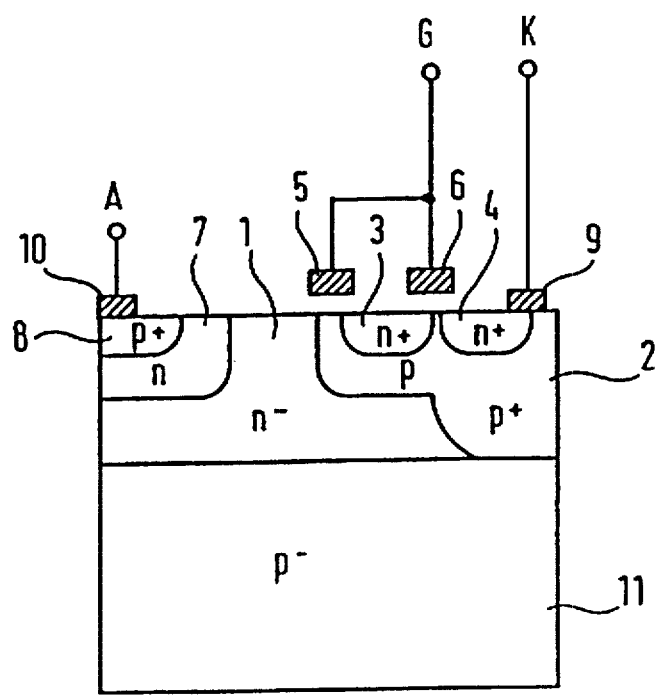
FIG. 49 is a cross-sectional view of a conventional thyristor.

FIG. 48 shows a conceptual cross-sectional view of a thyristor of a thirty-third embodiment according to the present invention, which is a modification from Example 30. According to this example, pn junction diode 19 of Example 30 is removed and the emitter electrode is directly connected to cathode (K). Further, a p$^-$-type layer 110 is formed between p-type base layer 2 and p-type emitter layer 8. The p$^-$-type layer 110 provides a Schottky electrode 111 which is connected with cathode (K).

According to Example 33, during turn-off operation, hole current can flow not only through MOS transistor 20 but also through Schottky electrode 111. Therefore, turn-off time may be reduced.

Numerous modifications and variations of the present invention are possible in light of the above teaching. It is therefore to be understood that within the scope of the appended claims, the invention may be practiced otherwise than as specifically described herein.

What is claimed is:

1. A thyristor comprising:
   a thyristor region including a first base semiconductor region of a first conductivity type, a second base semiconductor region of a second conductivity type in the first base semiconductor region, a first emitter semiconductor region of the first conductivity type in the second base semiconductor region, and a second emitter semiconductor layer of the second conductivity type in the first base semiconductor region;
   an first insulated gate electrode provided on the second base semiconductor region between the first emitter semiconductor region and the first base semiconductor region;
   a first electrode connected to the second emitter semiconductor region and having a potential applied thereto;
   a second electrode;
   a semiconductor switch coupled between said first emitter semiconductor region and said second electrode, thereby providing a first plurality of carriers to said first emitter semiconductor region from said second electrode; and a
   semiconductor rectifier coupled between said second electrode and said second base semiconductor region, thereby draining a second plurality of carriers.

2. A thyristor according to claim 1, wherein said semiconductor switch is selected from the group of a MOS transistor and an IGBT, and includes a second insulated gate electrode.

3. A thyristor according to claim 2, wherein a first channel is formed beneath said first insulated gate upon application of a first control signal thereto, a second channel is formed beneath said second insulated gate electrode upon application of a second control signal thereto, and said first control signal is removed prior to said second control signal, thereby removing said first channel prior to said second channel.

4. A thyristor according to claim 1, wherein said semiconductor rectifier is selected from the group of a pn-junction diode, a Schottky diode, and an IGBT.

5. A thyristor according to claim 1, wherein said thyristor region, said semiconductor rectifier and said semiconductor switch are formed in a single semiconductor layer, said single semiconductor layer including a first electrically isolating region located between said thyristor and one of said semiconductor switch and said semiconductor rectifier.

6. A thyristor according to claim 5, wherein said single semiconductor layer further includes a second electrically isolating region located between said semiconductor switch and said semiconductor rectifier.

7. A thyristor according to claim 5, further comprising:
   a substrate; and
   a buried layer provided between said substrate and said single semiconductor layer.

8. A thyristor according to claim 1, wherein the semiconductor rectifier comprises a Schottky diode, said Schottky diode having a first terminal including said first base semiconductor region and a second terminal including a Schottky electrode provided on said first base semiconductor region.

9. A thyristor according to claim 1, further comprising a semiconductor island region having the second conductivity type which is provided on said first base semiconductor region between said second base semiconductor region and said second emitter semiconductor region, and said semiconductor island region is electrically coupled to said second electrode via said semiconductor rectifier.

10. A thyristor comprising:
    a thyristor region including:
       a first base semiconductor region having a first conductivity type;
       a second base semiconductor region having a second conductivity type formed on said first base semiconductor region;
       a first emitter semiconductor region having a first conductivity type formed in said second base semiconductor region;
       a second emitter semiconductor region having the second conductivity type formed in the first base semiconductor region;
    a first insulated gate electrode provided on said second base semiconductor region between said first emitter semiconductor region and said first base semiconductor region;
    a first semiconductor region electrically isolated from said thyristor region, and including a first semiconductor layer having the first conductivity type, and a second semiconductor layer having the second conductivity type being provided in contact with said first semiconductor layer, thereby forming a pn-junction diode;
    a second semiconductor region electrically isolated from said thyristor region, and including an MOS transistor having a source region having the first conductivity type, a drain region having the first conductivity type, a third semiconductor layer having the second conductivity type provided between said source and drain regions, and a second insulated gate electrode provided on said third semiconductor layer between said source and drain regions;
    a first electrode electrically connected to said second emitter layer; and
    a second electrode electrically connected to said first semiconductor layer and said source region;
    wherein said drain region is electrically connected with said first emitter layer, and said second semiconductor layer is electrically connected to said second base semiconductor region.

11. A thyristor comprising:
    a thyristor region including a first base semiconductor region having a first conductivity type, a second base semiconductor region having a second conductivity type in said first base semiconductor region, a first emitter semiconductor region having the first conductivity type formed in said second base semiconductor region, and a second emitter semiconductor region having the second conductivity type formed in the first base semiconductor region;

a first insulated gate electrode formed on the second base semiconductor region between said first emitter semiconductor region and said first base semiconductor region;

a first electrode connected to the second emitter semiconductor region;

a second electrode;

a semiconductor switch coupled between said second base semiconductor region and said second electrode, thereby draining a first plurality of carriers from said second base semiconductor region to said second electrode; and a semiconductor rectifier coupled between said first emitter semiconductor region and said second electrode, thereby supplying a second plurality of carriers to said first emitter semiconductor region from said second electrode.

12. A thyristor according to claim 11, wherein said semiconductor switch includes a second insulated gate and is selected from the group of an MOS transistor and IGBT.

13. A thyristor according to claim 11, wherein said semiconductor rectifier is selected from the group of a pn-junction diode, a Schottky diode and an IGBT.

14. A thyristor according to claim 11, wherein said thyristor region, said semiconductor rectifier and said semiconductor switch are formed in a single semiconductor layer, said single semiconductor layer including a first electrically isolating region located between said thyristor and one of said semiconductor switch and said semiconductor rectifier.

15. A thyristor according to claim 14, wherein said single semiconductor layer further includes a second electrically isolating region located between said semiconductor switch and said semiconductor rectifier.

16. A thyristor according to claim 11, wherein the semiconductor rectifier comprises a Schottky diode, said Schottky diode having a first terminal including said first base semiconductor region and a second terminal including a Schottky electrode provided on said first base semiconductor region.

17. A thyristor comprising:

a thyristor region including a fist base semiconductor region having a first conductivity type, a second base semiconductor region having a second conductivity type formed in the first base semiconductor region, a first emitter semiconductor region having the first conductivity type formed in said second base semiconductor region, and a second emitter semiconductor region having the second conductivity type formed in the first base semiconductor region;

a first insulated gate electrode provided on said second base semiconductor region between said first emitter semiconductor region and said first base semiconductor region;

a first electrode connected to said second emitter semiconductor region;

a second electrode connected to said first emitter semiconductor region;

a semiconductor switch coupled between said second base semiconductor layer and said second electrode, thereby draining a first plurality of charge carriers in said second base semiconductor layer to said second electrode;

a semiconductor island region having the second conductivity type formed in the first base semiconductor region between said second base semiconductor region and said second emitter semiconductor region;

a Schottky electrode formed in Schottky contact with said semiconductor island region and electrically connected to said second electrode, thereby draining a second plurality of charge carriers from said first base region to said second semiconductor region.

18. A thyristor according to claim 17, wherein said semiconductor switch includes a second insulated gate electrode and is selected from the group of an MOS transistor and an IGBT.

19. A thyristor according to claim 17, wherein said thyristor region and said semiconductor switch are formed in a single semiconductor layer, said single semiconductor layer including an insulation region provided between said thyristor region and said semiconductor switch.

20. A thyristor comprising:

a thyristor region including a first base semiconductor region of a first conductivity type, a second base semiconductor region of a second conductivity type in the first base semiconductor region, a first emitter semiconductor region of the first conductivity type in the second base semiconductor region, and a second emitter semiconductor layer of the second conductivity type in the first base semiconductor region;

an first insulated gate electrode provided on the second base semiconductor region between the first emitter semiconductor region and the first base semiconductor region;

a first electrode connected to the second emitter semiconductor region and having a potential applied thereto;

a second electrode;

a semiconductor switch coupled between said first emitter semiconductor region and said second electrode, thereby providing a first plurality of carriers to said first emitter semiconductor region from said second electrode; and a semiconductor rectifier coupled between said second electrode and said second base semiconductor region, thereby draining a second plurality of carriers, wherein said semiconductor switch is an MOS transistor comprising:

a first terminal coupled to said first emitter semiconductor region;

a second terminal coupled to said second electrode and spaced from said first terminal; and an insulated gate electrode, wherein said first terminal has a first comb-shaped structure, said second terminal has a second comb-shaped structure complementary with said first comb shaped structure, and said insulated gate having a corresponding zig-zag shape provided between said first and second terminals.

21. A thyristor according to claim 1, wherein said semiconductor switch is an MOS transistor provided in a semiconductor substrate having a first conductivity type, said MOS transistor comprising:

a drain region in said semiconductor substrate having said first conductivity type;

a first doped region having a second conductivity type formed in said semiconductor substrate, said first doped region having a first impurity concentration;

a source region in said first doped region having said first conductivity type, said source region being spaced from an edge portion by a channel region in said first doped region at a surface of said semiconductor substrate;

an insulated gate electrode provided on said surface of said semiconductor substrate between said source and drain regions and overlying said channel region;

a second doped region having said second conductivity type provided in said first doped regions, said second doped region having a second impurity concentration greater than said first impurity concentration, wherein at least a portion of said second electrode contacts both said source region and said second doped region.

22. A thyristor comprising:

a thyristor region including a first base semiconductor region of a first conductivity type, a second base semiconductor region of a second conductivity type in the first base semiconductor region, a first emitter semiconductor region of the first conductivity type in the second base semiconductor region, and a second emitter semiconductor layer of the second conductivity type in the first base semiconductor region;

an first insulated gate electrode provided on the second base semiconductor region between the first emitter semiconductor region and the first base semiconductor region;

a first electrode connected to the second emitter semiconductor region and having a potential applied thereto;

a second electrode;

a semiconductor switch coupled between said first emitter semiconductor region and said second electrode, thereby providing a first plurality of carriers to said first emitter semiconductor region from said second electrode; and a semiconductor rectifier coupled between said second electrode and said second base semiconductor region, thereby draining a second plurality of carriers, wherein said semiconductor switch is an MOS transistor provided in a semiconductor substrate having a first conductivity type, said MOS transistor comprising:

a drain region in said semiconductor substrate having said first conductivity type;

a first doped region having a second conductivity type formed in said semiconductor substrate, said first doped region having a first impurity concentration;

a source region in said first doped region having said first conductivity type, said source region being spaced from an edge portion by a channel region in said first doped region at a surface of said semiconductor substrate;

an insulated gate electrode provided on said surface of said semiconductor substrate between said source and drain regions and overlying said channel region a second doped region having said second conductivity type provided in said first doped regions, said second doped region having a second impurity concentration greater than said first impurity concentration, at least a portion of said second electrode contacts both said source region and said second doped region and, said source region has a first comb-shaped structure in said surface of said substrate, said drain region has a second comb-shaped structure complementary to said first comb-shaped structure in said surface of said substrate, and said gate electrode has a corresponding zig-zag shape between said source and drain regions.

* * * * *